(12) United States Patent
Sugiyama et al.

(10) Patent No.: US 11,818,906 B2
(45) Date of Patent: Nov. 14, 2023

(54) DISPLAY DEVICE WITH REDUCED REFLECTION

(71) Applicant: Sony Group Corporation, Tokyo (JP)

(72) Inventors: Kouhei Sugiyama, Aichi (JP); Toshihiro Fukuda, Kanagawa (JP); Shinichi Tanaka, Aichi (JP)

(73) Assignee: Sony Group Corporation, Tokyo (JP)

( * ) Notice: Subject to any disclaimer, the term of this patent is extended or adjusted under 35 U.S.C. 154(b) by 139 days.

(21) Appl. No.: 15/746,929

(22) PCT Filed: May 25, 2016

(86) PCT No.: PCT/JP2016/065465
§ 371 (c)(1),
(2) Date: Jan. 23, 2018

(87) PCT Pub. No.: WO2017/018041
PCT Pub. Date: Feb. 2, 2017

(65) Prior Publication Data
US 2020/0058888 A1 Feb. 20, 2020

(30) Foreign Application Priority Data
Jul. 27, 2015 (JP) ................................ 2015-147359

(51) Int. Cl.
*H01L 51/50* (2006.01)
*H01L 51/52* (2006.01)
(Continued)

(52) U.S. Cl.
CPC ......... *H10K 50/115* (2023.02); *H10K 50/805* (2023.02); *H10K 50/841* (2023.02);
(Continued)

(58) Field of Classification Search
None
See application file for complete search history.

(56) References Cited

U.S. PATENT DOCUMENTS 7,722,225 B2 * 5/2010 Hwang ................ G02B 5/0226
362/331
9,269,922 B2 * 2/2016 Matsumoto ......... H01L 51/5284
(Continued)

FOREIGN PATENT DOCUMENTS

JP       09-127885 A    5/1997
JP    2005-353367 A   12/2005
(Continued)

OTHER PUBLICATIONS

Definition of 'area' downloaded from URL<https://www.merriam-webster.com/dictionary/area on Jun. 19, 2020. (Year: 2020).*
(Continued)

*Primary Examiner* — J. E. Schoenholtz
(74) *Attorney, Agent, or Firm* — Michael Best & Friedrich LLP

(57) ABSTRACT

A display device includes a first substrate 11, a second substrate 12, and a plurality of light emitting elements 10. Light is emitted via the second substrate 12. Each of the light emitting elements 10 is formed by laminating, from a side of the first substrate, a first electrode 51, an organic layer 70 having a light emitting layer, a second electrode 52, and a sealing layer 15. A light diffusion layer 80 containing fine particles 81 is formed between the sealing layer 15 and the second substrate 12. Orthographic images of the fine particles 81 in the light diffusion layer 80 do not overlap each other on the second substrate 12. Alternatively, the light diffusion layer is formed between the sealing layer and the second substrate, and the light diffusion layer includes a flat portion and a plurality of protruding portions each constituted by a part of a spherical surface protruding from the flat portion.

18 Claims, 7 Drawing Sheets

(51) Int. Cl.
  *H10K 50/115* (2023.01)
  *H10K 50/805* (2023.01)
  *H10K 50/84* (2023.01)
  *H10K 50/854* (2023.01)
  *H10K 50/858* (2023.01)
  *H10K 50/86* (2023.01)

(52) U.S. Cl.
  CPC ......... *H10K 50/854* (2023.02); *H10K 50/858* (2023.02); *H10K 50/865* (2023.02)

(56) References Cited

U.S. PATENT DOCUMENTS

| | | | | |
|---|---|---|---|---|
| 10,247,871 B2* | 4/2019 | Lee | ......................... | G02B 6/005 |
| 11,342,540 B2* | 5/2022 | Xu | ......................... | H01L 21/77 |
| 2004/0125285 A1* | 7/2004 | Arai | ................... | G02F 1/133555 |
| | | | | 349/113 |
| 2006/0043888 A1* | 3/2006 | Nakagawa | ......... | H01L 51/5281 |
| | | | | 313/506 |
| 2007/0103056 A1* | 5/2007 | Cok | ...................... | H01L 27/322 |
| | | | | 313/503 |
| 2007/0126353 A1* | 6/2007 | Kubota | ............... | H01L 51/5265 |
| | | | | 313/506 |
| 2007/0201056 A1 | 8/2007 | Cok et al. | | |
| 2008/0157654 A1 | 7/2008 | Cok | | |
| 2011/0234088 A1* | 9/2011 | Abe | ..................... | G02B 5/0215 |
| | | | | 313/504 |
| 2013/0062654 A1* | 3/2013 | Taima | ................. | G02B 5/0226 |
| | | | | 257/98 |
| 2013/0309933 A1* | 11/2013 | Hirakata | ............ | H01L 51/5246 |
| | | | | 445/11 |
| 2013/0320842 A1* | 12/2013 | Park | ....................... | H10K 59/38 |
| | | | | 313/512 |
| 2013/0328943 A1* | 12/2013 | Bita | ..................... | G09G 3/3466 |
| | | | | 345/690 |
| 2014/0063413 A1* | 3/2014 | Kim | ..................... | G02B 6/0035 |
| | | | | 349/61 |
| 2014/0152637 A1* | 6/2014 | Fujita | ................. | H01L 51/0085 |
| | | | | 345/211 |
| 2014/0191216 A1* | 7/2014 | Matsumoto | ......... | H01L 51/5284 |
| | | | | 257/40 |
| 2015/0060822 A1* | 3/2015 | Kamiya | .............. | H01L 51/5225 |
| | | | | 257/40 |
| 2015/0090991 A1* | 4/2015 | Ishii | .................... | H01L 27/3272 |
| | | | | 257/40 |
| 2015/0171372 A1* | 6/2015 | Iwata | ....................... | C09D 7/41 |
| | | | | 257/40 |
| 2015/0323711 A1* | 11/2015 | Bessho | ................ | G02B 5/0242 |
| | | | | 349/71 |
| 2016/0077254 A1* | 3/2016 | Lee | ........................ | G02B 5/206 |
| | | | | 359/599 |

FOREIGN PATENT DOCUMENTS

| | | | | |
|---|---|---|---|---|
| JP | 2005353367 A | * | 12/2005 | ......... H01L 51/5275 |
| JP | 2006-073219 A | | 3/2006 | |
| JP | 2010-186613 A | | 8/2010 | |
| JP | 2012-151122 A | | 8/2012 | |
| JP | 2014-506380 A | | 3/2014 | |
| JP | 2014-132525 A | | 7/2014 | |
| JP | 2014-191980 A | | 10/2014 | |
| JP | 2015-128027 A | | 7/2015 | |

OTHER PUBLICATIONS

Definition of 'area' downloaded from URL<https://www.merriam-webster.com/dictionary/area on Jun. 19, 2020.*
Definition of 'area', Webster's Ninth New Collegiate Dictionary. Springfield, Mass. : Merriam-Webster 1983.*
Definition of between downloaded from URL< https://www.merriam-webster.com/dictionary/between> on Apr. 6, 2021 (Year: 2021).*
Khlebtsov, Boris N., et al. "Determination of the Size, Concentration, and Refractive Index of Silica Nanoparticles from Turbidity Spectra." Langmuir, vol. 24, No. 16, 2008, pp. 8964-8970., doi:10. 1021/la8010053. (Year: 2008).*
Definition of along downloaded from URL <https://www.merriam-webster.com/dictionary/along> on Mar. 23, 2023 (Year: 2023).*

* cited by examiner

DISPLAY DEVICE WITH REDUCED REFLECTION

TECHNICAL FIELD

The present disclosure relates to a display device.

BACKGROUND ART

As a display device for displaying an image, an organic electroluminescence display device (hereinafter, also simply abbreviated as an "organic EL display device") using an organic electroluminescence element (hereinafter, also simply abbreviated as an "organic EL element") as a light emitting element (display element) has been developed. In the display device, if reflection of external light is large, a display quality is deteriorated, and therefore it is necessary to suppress reflection of external light. Reflection of external light is roughly divided into two components. One of the components is a component of Fresnel reflection occurring at an interface between a member constituting an outermost surface of the display device and air, and the other component is a reflection component obtained by emission of light incident on the display device to an outside of the display device (hereinafter, this reflection component is abbreviated as a "reflection component").

The organic EL display device has an organic EL element obtained by laminating a transparent electrode, an organic layer having a light emitting layer, and a metal electrode on a substrate. Therefore, light incident on the organic EL display device via the substrate passes through the transparent electrode and the organic layer, is reflected by the metal electrode, and is emitted to an outside of the organic EL display device. In addition, the light transmittance of constituent members other than a color filter layer is high, and therefore the light is emitted to the outside of the organic EL display device in a state where light is not sufficiently absorbed by the constituent members. Therefore, the reflection component increases.

Measures for reducing such a reflection component are well known from, for example, Japanese Patent Application Laid-Open No. 9-127885. In technology disclosed in this patent publication, a circular polarization unit is disposed on a side of a light emitting surface of a light emitting element.

Furthermore, light emitted from a light emitting layer is propagated in all directions. Therefore, as illustrated in a schematic partial cross-sectional view of FIG. 7, light emitted from a certain light emitting element (indicated by a thick solid line in FIG. 7) may enter a light emitting element adjacent to the certain light emitting element (referred to as an "adjacent light emitting element" for convenience), and may be emitted from the adjacent light emitting element to an outside. Note that such light is referred to as "light emitted from an adjacent light emitting element" for convenience. Regarding the reference signs in FIG. 7, refer to FIG. 1. As a result, deterioration in quality of a displayed image, such as image blur, bleeding, or resolution reduction may occur.

Technology for reducing such light emitted from an adjacent light emitting element is well known, for example, from Japanese Patent Application Laid-Open No. 2006-073219. In the technology disclosed in this patent publication, the thickness of a transparent resin layer is defined on the basis of geometric distances among various members constituting a light emitting element, and refractive indices thereof.

CITATION LIST

Patent Document

Patent Document 1: Japanese Patent Application Laid-Open No. 9-127885
Patent Document 2: Japanese Patent Application Laid-Open No. 2006-073219
Patent Document 3: Japanese Patent Application Laid-Open No. 2010-186613
Patent Document 4: Japanese Patent Application Laid-Open No. 2014-191980

SUMMARY OF THE INVENTION

Problems to be Solved by the Invention

Technology disclosed in Japanese Patent Application Laid-Open No. 9-127885 is very effective for reducing a reflection component. However, due to use of the circular polarization unit, a half or more of light emitted from a light emitting layer is lost, power consumption increases, and a light emitting element may be deteriorated due to an increase in a current flowing in the light emitting element. Technology disclosed in Japanese Patent Application Laid-Open No. 2006-073219 can effectively reduce color leakage from an adjacent light emitting element, but has large restrictions on designing a light emitting element disadvantageously. Technology for providing a high refractive index uneven layer or a high refractive index resin layer containing particles in order to efficiently emit light emitted from a light emitting layer to an outside is known from Japanese Patent Application Laid-Open No. 2010-186613 or Japanese Patent Application Laid-Open No. 2014-192980, for example. However, these patent publications do not mention anything about technology for reducing light emitted from an adjacent light emitting element, and the high refractive index uneven layer or the high refractive index resin layer is formed so as to be in direct contact with a transparent electrode constituting a light emitting element. Therefore, it is difficult to prevent light from entering the adjacent light emitting element by the high refractive index uneven layer or the high refractive index resin layer.

Therefore, an object of the present disclosure is to provide a display device having a configuration and a structure capable of reducing a reflection component obtained by emission of light incident on the display device from an outside to the outside of the display device, and capable of effectively reducing light emitted from an adjacent light emitting element.

Solutions to Problems

A display device according to first and second aspects of the present disclosure for achieving the above object includes a first substrate, a second substrate, and a plurality of light emitting elements located between the first substrate and the second substrate and arranged in a two-dimensional matrix, and emits light via the second substrate. Each of the light emitting elements is formed by laminating, from a side of the first substrate, a first electrode, an organic layer having a light emitting layer, a second electrode, and a sealing layer.

In addition, in the display device according to the first aspect of the present disclosure, a light diffusion layer containing particles is further formed between the sealing layer and the second substrate, and orthographic images of the particles in the light diffusion layer do not overlap each other on the second substrate. Incidentally, if the overlapping amount is 35% or less, preferably 30% or less, it can be said that orthographic images of the particles in the light diffusion layer do not overlap each other on the second substrate. Herein, the "overlapping amount" is represented by overlapping amount=$\{(L'/R)-1\}\times 100(\%)$ if a particle is assumed to be a sphere having a diameter R, and a distance between centers of two particles is represented by L' in orthographic images of the two particles overlapping each other on the second substrate.

Furthermore, in the display device according to the second aspect of the present disclosure, a light diffusion layer is further formed between the sealing layer and the second substrate, and the light diffusion layer includes a flat portion and a plurality of protruding portions each constituted by a part of a spherical surface protruding from the flat portion.

Effects of the Invention

In the display device according to the first aspect of the present disclosure, the light diffusion layer containing particles is formed between the sealing layer and the second substrate, and therefore it is possible to reduce a reflection component obtained by emission of light incident on the display device from an outside to the outside of the display device. Furthermore, orthographic images of the particles in the light diffusion layer do not overlap each other on the second substrate. Therefore, each of the particles functions as a kind of lens. When light emitted from a certain light emitting element enters an adjacent light emitting element and is emitted from the adjacent light emitting element to an outside, a ratio of the light totally reflected on an outer surface of the second substrate and returning to the adjacent light emitting element is increased. As a result, it is possible to effectively reduce light emitted from the adjacent light emitting element, and it is possible to suppress occurrence of deterioration in quality of a displayed image, such as image blur, bleeding, or resolution reduction. If the particles overlap each other in the light diffusion layer, such a light diffusion layer becomes a kind of light scattering layer. It is difficult to reduce light emitted from the adjacent light emitting element, and deterioration in quality of a displayed image, such as image blur, bleeding, or resolution reduction easily occurs. In the display device according to the second aspect of the present disclosure, the light diffusion layer including a flat portion and a plurality of protruding portions is formed between the sealing layer and the second substrate. Therefore, it is possible to reduce a reflection component obtained by emission of light incident on the display device from an outside to the outside of the display device. Furthermore, the light diffusion layer includes a flat portion and a plurality of protruding portions each constituted by a part of a spherical surface. Therefore, each of the protruding portions functions as a kind of lens. When light emitted from a certain light emitting element enters an adjacent light emitting element and is emitted from the adjacent light emitting element to an outside, a ratio of the light totally reflected on an outer surface of the second substrate and returning to the adjacent light emitting element is increased. As a result, it is possible to effectively reduce light emitted from the adjacent light emitting element, and it is possible to suppress occurrence of deterioration in quality of a displayed image, such as image blur, bleeding, or resolution reduction. Note that effects described herein are merely illustrative, and are not restrictive. In addition, an additional effect may be present.

MODE FOR CARRYING OUT THE INVENTION

Figure 1:
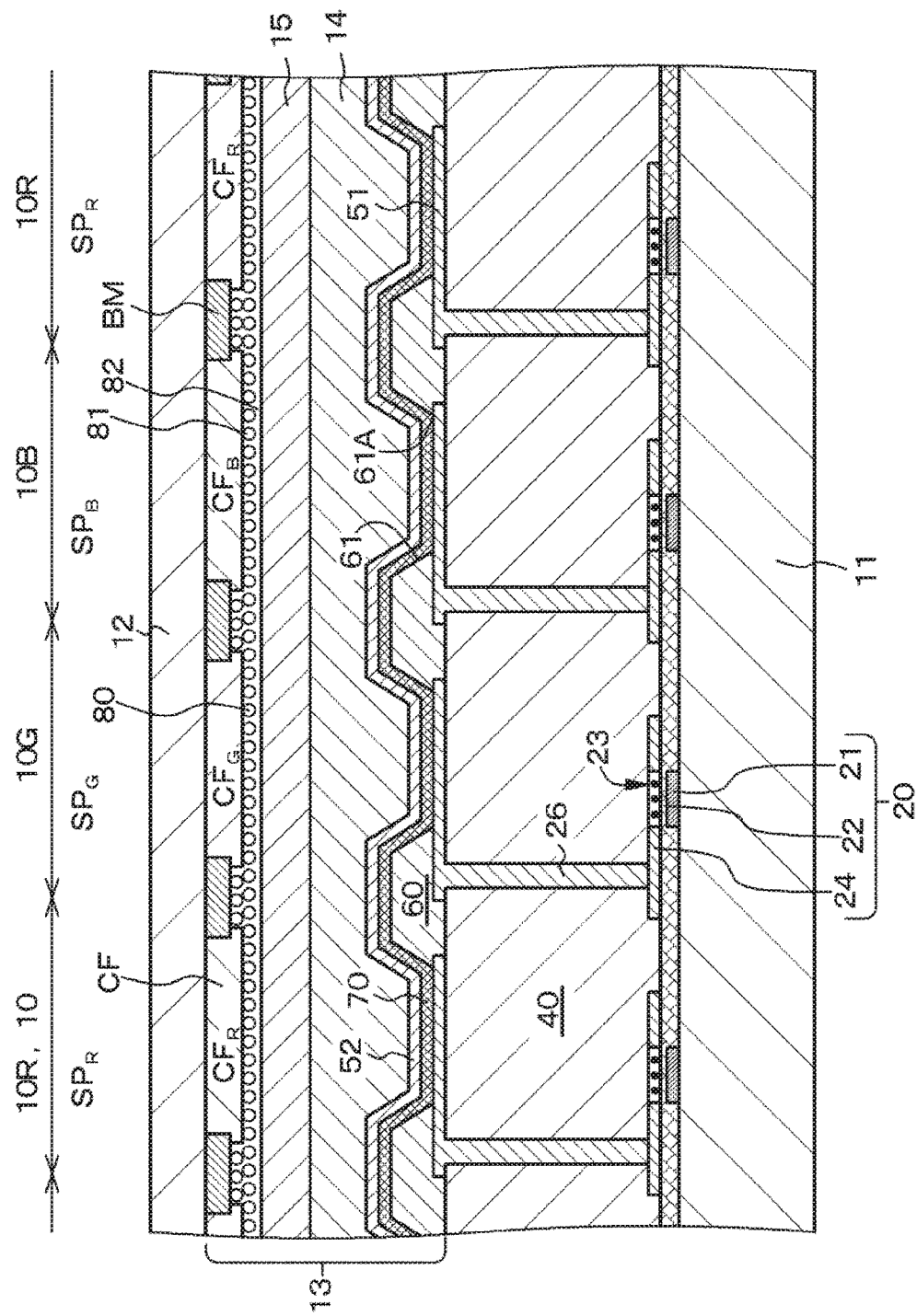
FIG. 1 is a schematic partial cross-sectional view of a display device of Example 1.

Hereinafter, the present disclosure will be described on the basis of Examples with reference to the drawings. However, the present disclosure is not limited to Examples, and various numerical values and materials in Examples are illustrative. Note that description will be made in the following order.

1. General description of display devices according to first and second aspects of the present disclosure
2. Example 1 (display device according to the first aspect of the present disclosure)
3. Example 2 (display device according to the second aspect of the present disclosure)
4. Example 3 (modification of Examples 1 and 2)
5. Others <General Description of Display Devices According to First and Second Aspects of the Present Disclosure>

In a display device according to a first aspect of the present disclosure, a particle is spherical and is regarded as a spherical lens (display device according to the first aspect of the present disclosure), or a protruding portion is regarded as a part of a spherical lens (display device according to a second aspect of the present disclosure). When a parallel light ray is incident on a spherical lens and is emitted from the spherical lens, if a maximum value of an angle formed by an optical axis of the spherical lens and the light ray emitted from the spherical lens (maximum angle) is represented by $\theta_{max}$, an average distance between a second electrode and a light diffusion layer is represented by T, the shortest distance between light emitting elements adjacent to each other is represented by L, the refractive index of a medium in contact with the light diffusion layer on a side of a second substrate is represented by n', and the refractive index of air is represented by $n_0$, $\alpha \geq \theta_{max} + \text{arc·sin}(n_0/n')$ is satisfied, provided that $\tan(\alpha) = L/T$ is satisfied. By adopting these forms, when light emitted from a certain light emitting element enters an adjacent light emitting element and is emitted from the adjacent light emitting element to an outside, a ratio of the light totally reflected on an outer surface of the second substrate and returning to the adjacent light emitting element is further increased. Therefore, it is possible to more effectively reduce the light emitted from the adjacent light emitting element. In addition, in these cases, $\alpha \geq 0.9\{\theta_{max} + \text{arc·sin}(n_0/n')\}$ is more preferably satisfied. The "medium in contact with a light diffusion layer on a side of a second substrate" means a color filter layer in a case where the color filter layer is formed between the light diffusion layer and the second substrate, and means the second substrate in a case where the light diffusion layer is formed on the second substrate.

Herein, the "shortest distance between light emitting elements adjacent to each other L" means the shortest distance between an edge of a first electrode constituting a certain light emitting element and an edge of a first electrode constituting an adjacent light emitting element adjacent to the certain light emitting element in a case where the light diffusion layer is formed on the second substrate. Furthermore, in a case where the color filter layer is formed between the light diffusion layer and the second substrate, the "shortest distance L to an adjacent light emitting element" means the shortest horizontal distance from a point where a second electrode intersects with the shortest straight line connecting an edge of a first electrode constituting a certain light emitting element and an edge of the color filter layer constituting an adjacent light emitting element adjacent to the certain light emitting element to the edge of the color filter layer constituting the adjacent light emitting element. The "optical axis of a spherical lens" means a parallel light ray incident on the spherical lens, and coincides with a light ray passing through the center of the spherical lens. The "orthographic images of particles" means a shadow of particles obtained on the second substrate when the particles are irradiated with a parallel light ray perpendicular to the second substrate. The maximum angle $\theta_{max}$ is a value depending on the refractive index of a material constituting a particle and a protruding portion and the refractive index of a material constituting a transparent material layer described below.

In the display device according to the first aspect of the present disclosure including the above preferable forms, the particle is spherical and the diameter of the particle may be 1/10 or more of the wavelength of light emitted from a light emitting layer. In the display device according to the second aspect of the present disclosure including the above preferable forms, the diameter of a part of a spherical surface constituting a protruding portion may be 1/10 or more of the wavelength of light emitted from a light emitting layer. By adopting these configurations, in a particle or a protruding portion, Rayleigh scattering is no longer dominant (that is, back scattering is reduced), and it is possible to suppress a decrease in luminous efficiency of a light emitting element. In addition, in these configurations, the diameter of a part of a spherical surface constituting a protruding portion is preferably not more than the wavelength of light emitted from a light emitting layer. By adopting such a configuration, in the protruding portion, Mie scattering is no longer dominant (that is, light is hardly observed as light spreading to the surroundings). It is possible to suppress occurrence of image bleeding, resolution reduction, or sharpness reduction more reliably. Furthermore, in the display device according to the first aspect of the present disclosure including the above-described preferable forms and configurations, $1<t/R<2$ is preferably satisfied when the thickness of a light diffusion layer is represented by t and the diameter of a particle is represented by R. Herein, the "wavelength of light emitted from a light emitting layer" is defined as a maximum wavelength (for example, 650 nm) of the wavelength of visible light. The diameter of a part of a spherical surface constituting a protruding portion can be measured using a scanning electron microscope, for example.

In the display devices according to the first and second aspects of the present disclosure including the above-described preferable forms and configurations, area variation of orthographic images of the particles in the light diffusion layer on the second substrate based on an effective area of the light emitting elements can be within 3%. Alternatively, area variation of the protruding portions based on an effective area of the light emitting elements can be within 3%. A ratio of the total area of the orthographic images of the particles in the light diffusion layer on the second substrate based on an effective area of the light emitting elements corresponds to a particle occupancy ratio. Herein, the "effective area of the light emitting elements" means the area of a portion of the first electrode in contact with the organic layer constituting each of the light emitting elements in a case where the light diffusion layer is formed on the second substrate. Furthermore, the "effective area of the light emitting element" means the area of a color filter layer in a case where the color filter layer is formed between the light diffusion layer and the second substrate. The "area variation" is determined as follows. That is, in each of nine regions of a region near an upper right corner of an image display region of the display device, a region near the center of an upper side, a region near an upper left corner, a region near the center of a right side, an image display region, a region near the center of a left side, a region near a lower right corner, a region near the center of a lower side, and a region near a lower upper corner, ten light emitting elements are selected. In each of the 90 light emitting elements in total, a total area $S_1$ of the orthographic images of the particles in the light diffusion layer on the second substrate is determined, or a total area $S_1'$ of the protruding portions is determined, and a coefficient of variation CV (standard deviation/average value) is determined from an average value and a standard deviation of $S_1$ or $S_1'$. The value of the coefficient of variation CV is taken as the area variation. The condition that the area variation is within 3% was obtained as a result of various experiments. If the total area of the orthographic images of the particles in the light diffusion layer on the second substrate or the total area of the protruding portions based on an effective area of the light emitting elements varies between the light emitting elements, a lens effect of the light diffusion layer varies, and the display device is visually recognized as glare that the display device is partially bright. As a result of experiments, it has been found that this glare is recognized in a case where the particle occupancy ratio in the light emitting element or the variation in the total area of the protruding portions exceeds 3%. In order to suppress this area variation, it is important that several or more particles or protrusions exist in the light emitting element. It is only required to determine the number of particles or protrusions in each of the light emitting elements on the basis of the diameters of the particles or the protrusions and the desired density of the particles or the protrusions (the number of particles or protrusions per effective area of the light emitting elements).

In the display device according to the first aspect of the present disclosure including the above-described preferable forms and configurations, $S_1/S_0 \leq 0.9$ is preferably satisfied when the total area of the orthographic images of the particles in the light diffusion layer on the second substrate is represented by $S_1$, and the effective area of the light emitting elements is represented by $S_0$. Furthermore, in the display device according to the second aspect of the present disclosure including the above-described preferable forms and configurations, $S_1'/S_0 \leq 0.9$ is preferably satisfied when the total area of the protruding portions is represented by $S_1'$, and the effective area of the light emitting elements is represented by $S_0$. Note that examples of a lower limit value of $S_1/S_0$ and a lower limit value of $S_1'/S_0$ include 0.1.

In the display devices according to the first and second aspects of the present disclosure including the above-described preferable forms and configurations, the color filter layer is formed between the light diffusion layer and the second substrate, and a light shielding layer can be formed between the color filter layer and the color filter layer. The color filter layer and the light shielding layer are formed on the second substrate.

Examples of a material constituting the particles in the display device according to the first aspect of the present disclosure include: an inorganic material such as titanium oxide ($TiO_2$), barium titanate ($BaTiO_3$), ZnS, $ZrO_2$, ZnO, glass, a quartz-based material such as silicon oxide, silicon nitride, aluminum oxide, barium oxide, or barium sulfate; and an organic material such as an acrylic resin, a polymethyl methacrylate-based resin, a divinylbenzene-based resin, a benzoguanamine-based resin, a styrene-based resin, a melamine-based resin, an acryl-styrene copolymer-based resin, a polycarbonate-based resin, a polyethylene-based resin, a polyvinyl chloride-based resin, or a silicone-based resin. Furthermore, in the light diffusion layer in the display device according to the first aspect of the present disclosure, a space between the particles is filled with a transparent material layer. Examples of a material constituting the transparent material layer include an acrylic resin. When the refractive index of a material constituting the particles is represented by $n_{11}$ and the refractive index of a material constituting the transparent material layer is represented by $n_{12}$, $|n_{11}-n_{12}|\geq 0.1$ is preferably satisfied. In the light diffusion layer in the display device according to the second aspect of the present disclosure, examples of a material constituting the flat portion and the protruding portions include a sealing resin, an overcoating resin, and an inorganic dielectric material. Furthermore, in the light diffusion layer in the display device according to the second aspect of the present disclosure, the protruding portions are filled with the transparent material layer. Examples of a material constituting the transparent material layer include an acrylic resin. When the refractive index of a material constituting the flat portion and the protruding portions is represented by $n_{21}$ and the refractive index of a material constituting the transparent material layer is represented by $n_{22}$, $|n_{21}-n_{22}|\geq 0.1$ is preferably satisfied. Note that the particle regarded as a spherical lens and the protruding portion regarded as a part of a spherical lens may function as a convex lens having positive optical power, or may function as a concave lens having negative optical power depending on a relationship between the refractive indices $n_{11}$ and $n_{21}$ of materials constituting the particle and the protruding portion, and the refractive indices $n_{12}$ and $n_{22}$ of the transparent material layer.

Specific examples of a method for forming the light diffusion layer in the display device according to the first aspect of the present disclosure include a method for applying a photosensitive resin having spherical particles of $SiO_2$ or the like dispersed therein and curing the photosensitive resin.

In the light diffusion layer of the display device according to the second aspect of the present disclosure, specific examples of a method for forming the protruding portion and the flat portion include a method for forming or disposing a protruding portion on a supporting substrate, and transferring the protruding portion to the second substrate (when the protruding portion is transferred to the second substrate, the protruding portion is peeled from the supporting substrate), and a combination of photolithography technology and etching technology.

The display devices according to the first and second aspects of the present disclosure including the above-described various preferable forms and configurations (hereinafter, these are collectively referred to as "the display device of the present disclosure or the like") are top emission type display devices that emit light from the second substrate. In addition, the display device has a plurality of light emitting elements, but each of the light emitting elements constitutes a sub-pixel. Furthermore, the organic EL element can constitute the light emitting element. The light emitting layer may be constituted by at least two light emitting layers that emit different colors. In this case, light emitted from the organic layer may be white. Specifically, the light emitting layer may have a structure obtained by laminating three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm), and emits white light as a whole. Alternatively, the light emitting layer may have a structure obtained by laminating two layers of a blue light emitting layer that emits blue light and a yellow light emitting layer that emits yellow light, and emits white light as a whole. Alternatively, the light emitting layer may have a structure obtained by laminating two layers of a blue light emitting layer that emits blue light and an orange light emitting layer that emits orange light, and emits white light as a whole. In addition, such a white light emitting element that emits white light includes a red color filter layer to constitute a red light emitting element. The white light emitting element includes a green color filter layer to constitute a green light emitting element. The white light emitting element includes a blue color filter layer to constitute a blue light emitting element. One pixel is constituted by a red light emitting element, a green light emitting element, and a blue light emitting element. In some cases, one pixel may be constituted by a red light emitting element, a green light emitting element, a blue light emitting element, and a light emitting element that emits white light (or a light emitting element that emits complementary color light). Note that, in the above form constituted by at least two light emitting layers that emit light of different colors, there is actually a case where the light emitting layers that emit light of different colors are mixed and are not clearly separated into the layers. Alternatively, one pixel may be constituted by three sub-pixels (light emitting elements) of a sub-pixel having a red light emitting layer and constituted by a light emitting element that emits red light, a sub-pixel having a green light emitting layer and constituted by a light emitting element that emits green light, and a sub-pixel having a blue light emitting layer and constituted by a light emitting element that emits blue light. Alternatively, one pixel may be constituted by four sub-pixels (light emitting elements) of a sub-pixel having a red light emitting layer and constituted by a light emitting element that emits red light, a sub-pixel having a green light emitting layer and constituted by a light emitting element that emits green light, a sub-pixel having a blue light emitting layer and constituted by a light emitting element that emits blue light, and a sub-pixel constituted by a light emitting element that emits white light (or a light emitting element that emits complementary color light).

The first substrate or the second substrate may be constituted by a high strain point glass substrate, a soda glass ($Na_2O \cdot CaO \cdot SiO_2$) substrate, a borosilicate glass ($Na_2O \cdot B_2O_3 \cdot SiO_2$) substrate, a forsterite ($2MgO \cdot (SiO_2)$) substrate, a lead glass ($Na_2O \cdot PbO \cdot SiO_2$) substrate, various glass substrates each having an insulating film formed on a surface thereof, a quartz substrate, a quartz substrate having an insulating film formed on a surface thereof, a silicon semiconductor substrate, or an organic polymer such as polymethyl methacrylate (PMMA), polyvinyl alcohol (PVA), polyvinyl phenol (PVP), polyether sulfone (PES), polyimide, polycarbonate, or polyethylene terephthalate (PET) (having a form of a polymer material such as a plastic film, a plastic sheet, or a plastic substrate constituted by a polymer material and having flexibility). Materials constituting the first substrate and the second substrate may be the same as or different from each other. However, the second substrate is required to be transparent to light emitted from the light emitting element.

In a case where the first electrode is caused to function as an anode electrode, examples of a material constituting the first electrode include aluminum (Al) and an alloy containing aluminum, and a metal having high work function, such as platinum (Pt), gold (Au), silver (Ag), chromium (Cr), molybdenum (Mo), titanium (Ti), tungsten (W), nickel (Ni), copper (Cu), iron (Fe), cobalt (Co), or tantalum (Ta), or an alloy thereof (for example, an Ag—Pd—Cu alloy containing silver as a main component and containing 0.3% by mass to 1% by mass of palladium (Pd) and 0.3% by mass to 1% by mass of copper (Cu), an Al—Nd alloy, or an Al—Ni alloy). The thickness of the first electrode may be 0.1 µm to 1 µm, for example. Alternatively, the material constituting the first electrode may be a transparent conductive material having excellent hole injection characteristics, such as an oxide of indium and tin (ITO) or an oxide of indium and zinc (IZO), or may have a structure obtained by laminating a transparent conductive material having excellent hole injection characteristics, such as an oxide of indium and tin (ITO) or an oxide of indium and zinc (IZO) on a dielectric multilayer film or a reflective film having high light reflectivity, including aluminum (Al) or the like. Meanwhile, in a case where the first electrode is caused to function as a cathode electrode, the first electrode is desirably constituted by a conductive material having a small work function value and high light reflectivity. However, by improving an electron injection property, for example, by disposing an appropriate electron injection layer in a conductive material having high light reflectivity used as an anode electrode, the resulting conductive material can also be used as a cathode electrode.

Meanwhile, in a case where the second electrode is caused to function as a cathode electrode, a material constituting the second electrode (a semi-light transmitting material or a light transmitting material) is desirably constituted by a conductive material having a small work function value so as to be able to transmit emitted light and inject an electron into an organic layer efficiently. Examples of the material constituting the second electrode include a metal having a small work function and an alloy thereof, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], an alloy of magnesium-calcium (Mg—Ca alloy), or an alloy of aluminum (Al) and lithium (Li) (Al—Li alloy). Among these materials, an Mg—Ag alloy is preferable, and a volume ratio between magnesium and silver may be Mg:Ag=5:1 to 30:1, for example. Alternatively, as a volume ratio between magnesium and calcium may be Mg:Ca=2:1 to 10:1, for example. The thickness of the second electrode may be 4 nm to 50 nm, preferably 4 nm to 20 nm, and more preferably 6 nm to 12 nm, for example. Alternatively, the second electrode may have a laminated structure of the above material layer and a so-called transparent electrode (for example, thickness $3 \times 10^{-8}$ m to $1 \times 10^{-6}$ m) including, for example, ITO or IZO, from the organic layer. A bus electrode (auxiliary electrode) including a low resistance material such as aluminum, an aluminum alloy, silver, a silver alloy, copper, a copper alloy, gold, or a gold alloy may be disposed in the second electrode to reduce resistance as a whole of the second electrode. Meanwhile, in a case where the second electrode is caused to function as an anode electrode, the second electrode is desirably constituted by a conductive material that transmits emitted light and has a large work function value. Average light transmittance of the second electrode is 50% to 90%, and preferably 60% to 90%.

Examples of a method for forming the first electrode or the second electrode include a combination of a vapor deposition method including an electron beam vapor deposition method, a hot filament vapor deposition method, and a vacuum vapor deposition method, a sputtering method, a chemical vapor deposition method (CVD method), an MOCVD method, and an ion plating method with an etching method; various printing methods such as a screen printing method, an inkjet printing method, and a metal mask printing method; a plating method (an electroplating method or an electroless plating method); a lift-off method; a laser ablation method; and a sol-gel method. According to various printing methods and a plating method, the first electrode or the second electrode having a desired shape (pattern) can be formed directly. Note that, in a case where the second electrode is formed after the organic layer is formed, the second electrode is preferably formed particularly on the basis of a film formation method in which energy of film formation particles is small, such as a vacuum vapor deposition method, or a film formation method such as an MOCVD method from a viewpoint of preventing the organic layer from being damaged. When the organic layer is damaged, non-light emitting pixels (or non-light emitting sub-pixels) called "dark spots" due to generation of a leak current may be generated. In addition, processes from formation of the organic layer to formation of these electrodes are preferably performed without exposure thereof to the atmosphere from a viewpoint of preventing deterioration of the organic layer due to moisture in the atmosphere. In some cases, the second electrode does not need to be patterned, and may be a so-called common electrode.

The organic layer includes a light emitting layer including an organic light emitting material. Specifically, for example, the organic layer may be constituted by a laminated structure of a hole transport layer, a light emitting layer, and an electron transport layer, a laminated structure of a hole transport layer and a light emitting layer serving also as an electron transport layer, or a laminated structure of a hole injection layer, a hole transport layer, a light emitting layer, an electron transport layer, and an electron injection layer. The light emitting layer may be constituted by a single light emitting layer that emits light of a single color, or may be constituted by a plurality of light emitting layers that emits light of a plurality of colors, as described above. In addition, an organic layer that emits white light as a whole can be obtained. However, in the latter case, as described above, there are cases where it cannot be clearly recognized that the light emitting layer is constituted by a plurality of light emitting layers. In addition, in a case where these laminated structures and the like are formed into a "tandem unit", the organic layer may have a tandem structure with two stages obtained by laminating a first tandem unit, a connection layer, and a second tandem unit. Furthermore, the organic layer may have a tandem structure with three or more stages obtained by laminating three or more tandem units. In these cases, by making an emission color such as red, green, or blue different among the tandem units, an organic layer that emits white light as a whole can be obtained. Examples of a method for forming the organic layer include a physical vapor deposition method (PVD method) such as a vacuum vapor deposition method; a printing method such as a screen printing method or an inkjet printing method; a laser transfer method in which an organic layer on a laser absorption layer is separated by irradiating a laminated structure of a laser absorption layer and an organic layer formed on a transfer substrate with a laser and the organic layer is transferred, and various coating methods. In a case where the organic layer is formed on the basis of the vacuum vapor deposition method, for example, using a so-called metal mask, the organic layer can be obtained by depositing a material that has passed through an opening disposed in the metal mask, or the organic layer may be formed on the entire surface without patterning.

Examples of a material constituting the sealing layer include a thermosetting adhesive such as an acrylic adhesive, an epoxy-based adhesive, a urethane-based adhesive, a silicone-based adhesive, or a cyanoacrylate-based adhesive, and an ultraviolet curable adhesive.

An insulating or conductive protective film is preferably disposed on the second electrode, that is, between the second electrode and the sealing layer in order to prevent moisture from reaching the organic layer. The protective film is preferably formed particularly on the basis of a film formation method in which the energy of film formation particles is small, such as a vacuum vapor deposition method, or a film formation method such as a CVD method or an MOCVD method because an influence on a base can be reduced. Alternatively, in order to prevent degradation of brightness due to deterioration of the organic layer, a film formation temperature is desirably set to room temperature. Furthermore, in order to prevent peeling of the protective film, the protective film is desirably formed under a condition minimizing a stress of the protective film. In addition, the protective film is preferably formed without exposure of an already formed electrode to the atmosphere. As a result, deterioration of the organic layer due to moisture or oxygen in the atmosphere can be prevented. Furthermore, the protective film is desirably constituted by a material that transmits light generated in the organic layer by, for example, 80% or more. Specific examples of the material include an inorganic amorphous insulating material such as the following materials. Such an inorganic amorphous insulating material does not generate grains, and therefore has low water permeability and constitutes a good protective film. Specifically, as a material constituting the protective film, a material that is transparent to light emitted from the light emitting layer, is dense, and does not transmit moisture is preferably used. More specific examples of the material include amorphous silicon ($\alpha$-Si), amorphous silicon carbide ($\alpha$-SiC), amorphous silicon nitride ($\alpha$-Si$_{1-x}$N$_x$), amorphous silicon oxide ($\alpha$-Si$_{1-y}$O$_y$), amorphous carbon ($\alpha$-C), amorphous silicon oxide/nitride ($\alpha$-SiON), and Al$_2$O$_3$. In a case where the protective film is constituted by a conductive material, the protective film is only required to be constituted by a transparent conductive material such as ITO or IZO.

The protective film and the light diffusion layer are bonded by the sealing layer. A planarization film may be formed between the light diffusion layer and the sealing layer. Furthermore, in the display device according to the first aspect of the present disclosure, the planarization film may be formed between the light diffusion layer and the second substrate (or the color filter layer and the light shielding layer).

The color filter layer is constituted by a resin to which a coloring agent containing a desired pigment or dye is added. By selecting a pigment or a dye, adjustment is performed such that light transmittance in a target wavelength range of red, green, blue, or the like is high, and light transmittance in the other wavelength ranges is low. For a light emitting element that emits white light, it is only required to dispose a transparent filter layer. As described above, the light shielding layer (black matrix layer) is formed between the color filter layer and the color filter layer. For example, the light shielding layer is constituted by a black resin film (specifically, including a black polyimide resin, for example) having an optical density of 1 or more, mixed with a black coloring agent, or a thin film filter using interference of a thin film. The thin film filter is formed by laminating two or more thin films including metal, metal nitride, or metal oxide, for example, and attenuates light by utilizing interference of a thin film. Specific examples of the thin film filter include a thin film filter obtained by alternately laminating Cr and chromium(III) oxide ($Cr_2O_3$). In a portion of the light diffusion layer including the particles overlapping with the light shielding layer, orthographic images of the particles in the light diffusion layer do not have to overlap or may overlap each other on the second substrate.

In the display device, the first electrode is disposed on an interlayer insulation layer, for example. In addition, this interlayer insulation layer covers a light emitting element driving unit formed on the first substrate (or the first substrate). The light emitting element driving unit is constituted by one or more transistors (for example, MOSFETs or TFTs). The transistors are electrically connected to the first electrode via a contact hole (contact plug) disposed in the interlayer insulation layer. The light emitting element driving unit can have a known circuit configuration. As a constituent material of the interlayer insulation layer, an $SiO_2$-based material such as $SiO_2$, BPSG, PSG, BSG, AsSG, PbSG, SOG (spin on glass), low melting point glass, or glass paste; an SiN-based material including an SiON-based material; or an insulating resin such as an acrylic resin or a polyimide resin can be used singly or in combination thereof appropriately. For forming the interlayer insulation layer, a known process such as a CVD method, a coating method, a sputtering method, or various printing methods can be used.

A structure may be employed in which an insulation layer may be formed on the interlayer insulation layer and the first electrode, an opening may be disposed in the insulation layer on the first electrode, and the first electrode may be exposed to a bottom of the opening. The organic layer is formed over the insulation layer from above the first electrode exposed to a bottom of the opening. Alternatively, the insulation layer may be formed on the interlayer insulation layer exposed between the first electrode and the first electrode. The organic layer is formed over the insulation layer from above the first electrode. The insulation layer may be constituted by a material constituting the above interlayer insulation layer. The material constituting the insulation layer and the material constituting the interlayer insulation layer may be the same as or different from each other. Usually, an edge of the opening corresponds to an edge of a portion of the first electrode in contact with the organic layer.

The organic EL display device may have a resonator structure in order to further improve light extraction efficiency. Specifically, light emitted from the light emitting layer may be caused to resonate between a first interface constituted by an interface between the first electrode (or a light reflecting layer disposed below the first electrode via the interlayer insulation layer) and the organic layer and a second interface constituted by an interface between the second electrode and the organic layer, and a part of the light may be emitted from the second electrode. In addition, when a distance from a maximum emission position of the light emitting layer to the first interface is represented by $L_1$, an optical distance thereof is represented by $OL_1$, a distance from the maximum emission position of the light emitting layer to the second interface is represented by $L_2$, an optical distance thereof is represented by $OL_2$, and $m_1$ and $m_2$ each represent an integer, the following formulas (1-1), (1-2), (1-3), and (1-4) are satisfied.

$$0.7\{-\Phi_1/(2\pi)+m_1\} \leq 2 \times OL_1/\lambda \leq 1.2\{-\Phi_1/(2\pi)+m_1\} \quad (1\text{-}1)$$

$$0.7\{-\Phi_2/(2\pi)+m_2\} \leq 2 \times OL_2/\lambda \leq 1.2\{-\Phi_2/(2\pi)+m_2\} \quad (1\text{-}2)$$

$$L_1 < L_2 \quad (1\text{-}3)$$

$$m_1 < m_2 \quad (1\text{-}4)$$

Herein, $\lambda$: Maximum peak wavelength of a spectrum of light generated in the light emitting layer (or a desired wavelength among wavelengths of light generated in the light emitting layer)

$\Phi_1$: Phase shift amount (unit: radian) of light reflected on the first interface Provided that $-2\pi < \Phi_1 \leq 0$ is satisfied.

$\Phi_2$: Phase shift amount (unit: radian) of light reflected on the second interface Provided that $-2\pi < \Phi_2 \leq 0$ is satisfied.

Herein, $m_1=0$ and $m_2=1$ that can maximize a light extraction efficiency can be satisfied.

Incidentally, the distance $L_1$ from the maximum emission position of the light emitting layer to the first interface means an actual distance (physical distance) from the maximum emission position of the light emitting layer to the first interface, and the distance $L_2$ from the maximum emission position of the light emitting layer to the second interface means an actual distance (physical distance) from the maximum emission position of the light emitting layer to the second interface. In addition, the optical distance is also called an optical path length, and generally means n×L when a light ray passes through a medium having a refractive index n for a distance L. The same applies to the following description. Therefore, when the average refractive index of the organic layer (or the organic layer and the interlayer insulation layer) is $n_{ave}$, there is a relationship of $$OL_1 = L_1 \times n_{ave} \text{ and}$$

$$OL_2 = L_2 \times n_{ave}.$$

Herein, the average refractive index $n_{ave}$ is obtained by summing up a product of the refractive index and the thickness of each layer constituting the organic layer (or the organic layer and the interlayer insulation layer), and dividing the resulting sum by the thickness of the organic layer (or the organic layer and the interlayer insulation layer).

The first electrode or the light reflecting layer and the second electrode absorb a part of incident light and reflect the rest. Therefore, a phase shift occurs in the reflected light. The phase shift amounts $\Phi_1$ and $\Phi_2$ can be determined by measuring values of a real number part and an imaginary number part of a complex refractive index of a material constituting the first electrode or the light reflecting layer and the second electrode, for example, using an ellipsometer, and performing calculation based on these values (refer to, for example, "Principles of Optic", Max Born and Emil Wolf, 1974 (PERGAMON PRESS)). Note that the refractive index of the organic layer, the interlayer insulation layer, or the like can also be determined by measurement with an ellipsometer.

As described above, in an organic EL display device having a resonator structure, actually, a red light emitting element constituted by inclusion of a red color filter layer in a white light emitting element causes red light emitted from the light emitting layer to resonate, and emits reddish light (light having a light spectrum peak in a red region) from the second electrode. In addition, the green light emitting element constituted by inclusion of a green color filter layer in a white light emitting element causes green light emitted from the light emitting layer to resonate, and emits greenish light (light having a light spectrum peak in a green region) from the second electrode. In addition, the blue light emitting element constituted by inclusion of a blue color filter layer in a white light emitting element causes blue light emitted from the light emitting layer to resonate, and emits blueish light (light having a light spectrum peak in a blue region) from the second electrode. That is, it is only required to design each light emitting element by determining a desired wavelength $\lambda$ (specifically, wavelengths of red light, green light, and blue light) among wavelengths of light generated in the light emitting layer and determining various parameters such as $OL_1$ and $OL_2$ in each of the red light emitting element, the green light emitting element, and the blue light emitting element on the basis of formulas (1-2), (1-2), (1-3), and (1-4).

Examples of a material constituting the light reflecting layer include aluminum, an aluminum alloy (for example, Al—Nd), a Ti/Al laminated structure, chromium (Cr), silver (Ag), and a silver alloy (for example, Ag—Pd—Cu or Ag—Sm—Cu). The light reflecting layer can be formed, for example, by a vapor deposition method including an electron beam vapor deposition method, a hot filament vapor deposition method, and a vacuum vapor deposition method, a sputtering method, a CVD method, and an ion plating method; a plating method (an electroplating method or an electroless plating method); a lift-off method; a laser ablation method; a sol-gel method, or the like.

In the organic EL display device, the thickness of a hole transport layer (hole supply layer) and the thickness of an electron transport layer (electron supply layer) are desirably substantially equal to each other. Alternatively, the thickness of the electron transport layer (electron supply layer) may be larger than that of the hole transport layer (hole supply layer). As a result, an electron can be supplied sufficiently to the light emitting layer in an amount necessary for a high efficiency at a low driving voltage. That is, by disposing a hole transport layer between the first electrode corresponding to an anode electrode and the light emitting layer, and forming the hole transport layer with a film having a film thickness smaller than the electron transport layer, supply of holes can be increased. Then, this makes it possible to obtain a carrier balance with no excess or deficiency of holes and electrons and a sufficiently large carrier supply amount. Therefore, high emission efficiency can be obtained. In addition, due to no excess or deficiency of holes and electrons, the carrier balance hardly collapses, drive deterioration is suppressed, and an emission lifetime can be prolonged.

In the display device of the present disclosure or the like, in a form in which one pixel (or sub-pixel) is constituted by one light emitting element (display element), examples of arrangement of a pixel (or sub-pixel) include stripe arrangement, diagonal arrangement, delta arrangement, and rectangle arrangement although not being limited thereto. Furthermore, in a form in which one pixel (or sub-pixel) is constituted by assembly of a plurality of light emitting elements (display elements), examples of arrangement of a pixel (or sub-pixel) include stripe arrangement although not being limited thereto.

On an outermost surface of the display device (outer surface of the second substrate), an ultraviolet absorbing layer, a contamination preventing layer, a hard coat layer, and an antistatic layer may be formed, or a protective member may be disposed.

The display device of the present disclosure or the like can be used, for example, as a monitor device constituting a personal computer, or a monitor device incorporated in a television receiver, a mobile phone, a personal digital assistant (PDA), or a game machine. Alternatively, the display device of the present disclosure or the like can be applied to an electronic view finder (EVF) or a head mounted display (HMD).

Example 1

Example 1 relates to the display device (specifically, organic EL display device) according to the first aspect of the present disclosure. FIG. 1 illustrates a schematic partial cross-sectional view of the display device of Example 1. Note that, in FIG. 1 or FIG. 5 described below, hatching is omitted for the light diffusion layer, the particles, and the transparent material layer. The display device of Example 1 or the display device of Example 2 or 3 described below is an active matrix type display device of color display, and is a top emission type display device. That is, light is emitted via the second electrode.

That is, the display device of Example 1 or the display device of Example 2 or 3 described below includes a first substrate 11, a second substrate 12, and a plurality of light emitting elements (display elements) 10 located between the first substrate 11 and the second substrate 12 and arranged in a two-dimensional matrix, and emits light via the second substrate 12. Each of the light emitting elements 10 is formed by laminating, from a side of the first substrate, a first electrode 51, an organic layer 70 having a light emitting layer, a second electrode 52, and a sealing layer 15. Organic EL elements which are light emitting elements are arranged in a two-dimensional matrix in a first direction and a second direction extending in a direction orthogonal to the first direction.

Alternatively, in another expression, the display device of Example 1 or the display device of Example 2 or 3 described below includes the first substrate 11, the second substrate 12, and an image display unit 13 sandwiched by the first substrate 11 and the second substrate 12. In the image display unit 13, the plurality of light emitting elements 10 is arranged in a two-dimensional matrix.

In addition, in the display device of Example 1, a light diffusion layer 80 containing particles (fine particles) 81 is further formed between the sealing layer 15 and the second substrate 12, and orthographic images of the particles 81 in the light diffusion layer 80 do not overlap each other on the second substrate 12. That is, in the light diffusion layer 80, the particles 81 do not overlap each other, and the particles 81 are arranged in a single layer state and in the closest packed state, or in a random state, or in a state in which a gap is formed. In the display device of Example 1 or the display device of Example 2 or 3 described below, a color filter layer CF is formed between the light diffusion layer 80 or 90 and the second substrate 12, and a light shielding layer (black matrix layer) BM is formed between the color filter layer CF and the color filter layer CF. The color filter layer CF and the light shielding layer BM are formed in contact with the second substrate 12. Therefore, specifically, the light diffusion layer 80 or 90 is formed between the sealing layer 15 and the color filter layer CF.

Here, each of the particles 81 is spherical. Specifically, each of the particles 81 includes silica ($SiO_2$) having a diameter of $1\times10^{-6}$ m (1 μm), and has a value of the refractive index $n_{11}$ of 1.46. The wavelength of light emitted from the light emitting layer is 430 nm to 650 nm. The wavelength of the light emitted from the light emitting layer is the maximum wavelength of visible light (specifically, 650 nm). The diameter of each of the particles 81 is 1/10 or more of the wavelength of the light emitted from the light emitting layer and not more than the wavelength of the light emitted from the light emitting layer. Furthermore, when the thickness of the light diffusion layer 80 is represented by t and the diameter of each of the particles 81 is represented by R, 1<t/R<2 is satisfied. Specifically, the thickness t of the light diffusion layer 80 is 1.5 μm.

A space between the particles 81 is filled with a transparent material layer 82. The transparent material layer 82 includes an acrylic resin, and has a value of the refractive index $n_{12}$ of 1.7 to 1.8. $|n_n-n_{12}|\geq 0.1$ is satisfied.

Furthermore, in the display device of Example 1, area variation of orthographic images of the particles 81 in the light diffusion layer 80 on the second substrate 12 based on an effective area of the light emitting elements 10 (in Example 1, specifically, the area of the color filter layer CF constituting each light emitting element, and the same applies to the following Examples) was within 3% (specifically, 1%). Furthermore, in the display device of Example 1, $S_1/S_0\leq 0.9$ is satisfied when the total area of the orthographic images of the particles 81 in the light diffusion layer 80 on the second substrate 12 is represented by $S_1$, and the effective area of the light emitting elements 10 is represented by $S_0$. Specifically, $S_1/S_0=0.2$ was satisfied.

One pixel is constituted by three sub-pixels (three light emitting elements) of a red display sub-pixel $SP_R$ (red light emitting element 10R), a green display sub-pixel $SP_G$ (green light emitting element 10G), and a blue display sub-pixel $SP_B$ (blue light emitting element 10B). The second substrate 12 includes color filter layers $CF_R$, $CF_G$, and $CF_B$. Each color light emitting sub-pixel is constituted by a light emitting element (organic EL element) that emits white light and includes the color filter layers $CF_R$, $CF_G$, and $CF_B$. That is, the light emitting layer itself emits white light as a whole. The red light emitting element (red display element) 10R, the green light emitting element (green display element) 10G, and the blue light emitting element (blue display element) 10B have the same configuration and structure except for the color filter layer CF. In addition, as described above, the light shielding layer (black matrix layer) BM is disposed between the color filter layer CF and the color filter layer CF. The number of pixels is, for example, 1920×1080. One of the light emitting elements 10 constitutes one sub-pixel, and the number of light emitting elements (specifically, organic EL elements) 10 is three times the number of pixels.

In the display device of Example 1 or the display device of Example 2 or 3 described below, the first electrode 51 functions as an anode electrode, the second electrode 52 functions as a cathode electrode, and the second electrode 52 includes a transparent conductive material such as ITO. In addition, the second substrate 12 includes a glass substrate. The first electrode 51 is formed on the basis of a combination of a vacuum deposition method and an etching method. A film of the second electrode 52 is formed particularly by a film formation method in which film forming particles have small energy, such as a vacuum vapor deposition method, and is not patterned. The organic layer 70 is not patterned, either. Furthermore, in the display device of Example 1 or the display device of Example 2 described below, the first substrate 11 includes a glass substrate, and the first electrode 51 includes a light reflecting material, specifically, an Al—Nd alloy or an Al—Ni alloy.

The first electrode 51 is disposed on an interlayer insulation layer 40 including SiON and formed on the basis of a CVD method. In addition, the interlayer insulation layer 40 covers an organic EL element driving unit formed on the first substrate 11. The organic EL element driving unit is constituted by a plurality of TFTs (thin film transistors) 20. The TFTs 20 are electrically connected to the first electrode 51 via a contact plug 26 disposed in the interlayer insulation layer 40. An actual light emitting portion of the organic layer 70 is surrounded by an insulation layer 60 including $SiO_2$. Note that, in the drawings, one TFT 20 is illustrated for one organic EL element driving unit.

The organic layer 70 having a light emitting layer including an organic light emitting material is disposed as a continuous layer common to all pixels. The organic layer 70 has a laminated structure obtained, for example, by sequentially laminating, from a side of the first electrode, a hole injection layer, a hole transport layer, a light emitting layer (a light emitting layer that generates white light by color mixing, specifically constituted by a red light emitting layer, a green light emitting layer, and a blue emitting layer), and an electron transport layer, and generates white light. Note that there is a case where the red light emitting layer, the green light emitting layer, and the blue light emitting layer cannot be clearly distinguished from one another. The hole injection layer injects holes into the hole transport layer, and includes a hexaazatriphenylene derivative, for example. The hole transport layer transports the holes injected from the hole injection layer to the light emitting layer, and includes 4,4',4"-tris(3-methylphenylphenylamino) triphenylamine (m-MTDATA) or α-naphthylphenyl diamine (αNPD), for example. The red light emitting layer generates red light utilizing an organic EL phenomenon, and is formed by mixing 30% by mass of 2,6-bis[(4'-methoxydiphenylamino) styryl]-1,5-dicyanonaphthalene (BSN) with 4,4-bis(2,2-diphenylvinin) biphenyl (DPVBi), for example. The green light emitting layer generates green light utilizing an organic EL phenomenon, and is formed by mixing 5% by mass of coumarin 6 with DPVBi, for example. The blue light emitting layer generates blue light utilizing an organic EL phenomenon, and is formed by mixing 2.5% by mass of 4,4'-bis [2-{4-(N,N-diphenylamino) phenyl} vinyl]biphenyl (DPAVBi) with DPVBi, for example. The electron transport layer transports electrons to the light emitting layer, and includes 8-hydroxyquinoline aluminum (Alq3), for example. However, the materials constituting the layers are illustrative, and are not limited to these materials. Furthermore, for example, the light emitting layer may be constituted by a blue light emitting layer and a yellow light emitting layer, or may be constituted by a blue light emitting layer and an orange light emitting layer.

Each of the light emitting elements 10 may have a resonator structure in which the organic layer 70 is a resonance part. In this case, in order to appropriately adjust a distance from a light emitting surface to a reflecting surface (specifically, for example, the first electrode 51 and the second electrode 52), the thickness of the organic layer 70 is preferably $8\times10^{-8}$ m or more and $5\times10^{-7}$ m or less, and more preferably $1.5\times10^{-7}$ m or more and $3.5\times10^{-7}$ m or less.

An insulating or conductive protection film 14 (specifically, including a $SiO_2$-based material or a SiN-based material, for example) is disposed above the second electrode 52, that is, between the second electrode 52 and the sealing layer (sealing resin layer) 15 in order to prevent moisture from reaching the organic layer 70. The protective film 14 is bonded to the second substrate 12 (more specifically, the light diffusion layer 80) via the sealing layer (sealing resin layer) 15 including, for example, an acrylic adhesive or an epoxy-based adhesive.

The TFT 20 is constituted by a gate electrode 21 formed on the first substrate 11, a gate insulation layer 22 formed on the first substrate 11 and the gate electrode 21, a source/drain region 24 formed on the gate insulation layer 22, and a channel formation region 23 formed between the source/drain regions 24 so as to face the gate electrode 21.

Hereinafter, the outline of a method for manufacturing the display device (organic EL display device) of Example 1 will be described.

The second substrate 12 is prepared. Specifically, the color filter layer CF and the light shielding layer BM are formed on the second substrate 12 by a known method. Then, the light diffusion layer 80 is formed on the color filter layer CF and the light shielding layer BM. Specifically, the light diffusion layer 80 can be formed by a method for applying a photosensitive resin having spherical particles of $SiO_2$ dispersed therein and curing the photosensitive resin. Thereafter, in order to fill a space between the particles 81, the transparent material layer 82 is formed on the light diffusion layer 80 by a combination of a CVD method and an etching method or a coating method depending on a material constituting the transparent material layer 82. Thereafter, a top surface of the transparent material layer 82 is planarized to planarize the transparent material layer 82.

[Step-100]

Meanwhile, a light emitting element driving unit is formed on the first substrate 11 on the basis of a known TFT manufacturing process, and then the interlayer insulation layer 40 is formed on the entire surface on the basis of a CVD method. Then, in a portion of the interlayer insulation layer 40 located above one of the source/drain regions 24 of the TFT 20, a connection hole is formed on the basis of photolithography technology and etching technology. Thereafter, a metal layer is formed on the interlayer insulation layer 40 including the connection hole on the basis of a sputtering method, for example. Subsequently, the metal layer is patterned on the basis of photolithography technology and etching technology, and the first electrode 51 can be thereby formed on the interlayer insulation layer 40. Furthermore, the contact plug 26 can be formed in the interlayer insulation layer 40. The first electrode 51 is separated for each light emitting element.

[Step-110]

Thereafter, the insulation layer 60 including $SiO_2$ is formed on the entire surface on the basis of a CVD method. Thereafter, an opening 61 is formed in a portion of the insulation layer 60 located above the first electrode 51 based on photolithography technology and etching technology, and the first electrode 51 is exposed to a bottom of the opening 61. Examples of a planar shape of the opening 61 include a square shape, a square shape with four corners rounded, a rectangular shape, a rectangular shape with four corners rounded, a circular shape, and an elliptical shape.

[Step-120]

Thereafter, the organic layer 70 is formed on a portion of the first electrode 51 exposed to a bottom of the opening 61 and the insulation layer 60 by a PVD method such as a vacuum vapor deposition method or a sputtering method, or a coating method such as a spin coating method or a die coating method, for example. Subsequently, the second electrode 52 is formed on the entire surface of the organic layer 70 on the basis of a vacuum vapor deposition method, for example. In this way, films of the organic layer 70 and the second electrode 52 can be continuously formed on the first electrode 51, for example, in a vacuum atmosphere. Thereafter, the protective film 14 is formed on the entire surface by a CVD method or a PVD method, for example.

Incidentally, a lowermost layer of the organic layer 70 may be constituted by a charge injection/transport layer, and at the time of forming the organic layer 70, at least a part of the charge injection/transport layer may be in a discontinuous state (stage-discontinuous state) at an edge 61A of the opening 61 in the insulation layer 60. That is, the charge injection/transport layer is brought into a discontinuous state or in a high resistance state. In addition, as a result, the resistance of the charge injection/transport layer is increased. Therefore, occurrence of a phenomenon that a leakage current flows via the charge injection/transport layer between a first electrode of a certain light emitting element and a second electrode constituting an adjacent light emitting element can be prevented. Incidentally, specifically, the charge injection/transport layer may be constituted by a hole injection layer. In a case where the hole injection layer is not formed but a hole transport layer is formed, the charge injection/transport layer may be constituted by the hole transport layer.

[Step-140]

Finally, the protective film 14 is bonded to the light diffusion layer 80 (specifically, the transparent material layer 82) via the sealing layer (sealing resin layer) 15. In this way, the display device illustrated in FIG. 1 can be obtained.

Figure 2A:
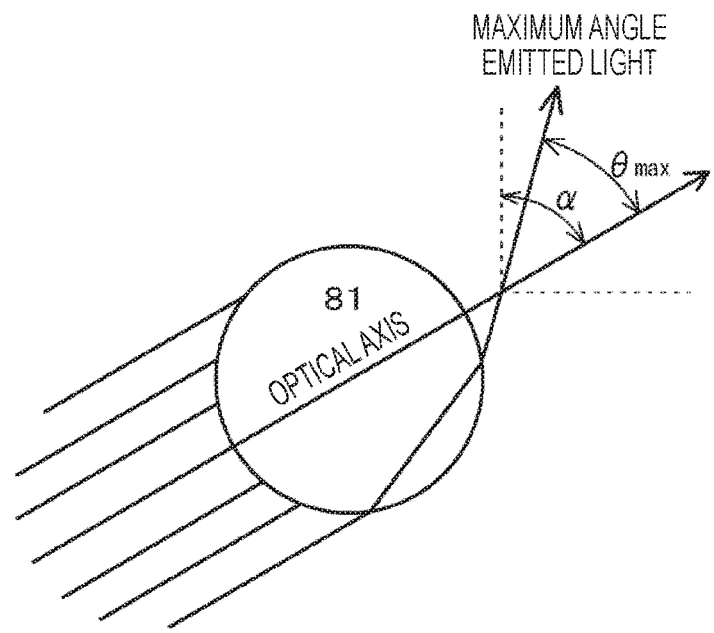
FIG. 2A and FIG. 2B are a model diagram when parallel light is incident on one particle and a diagram schematically illustrating behavior of light inside the display device of Example 1, respectively.
Figure 2B:
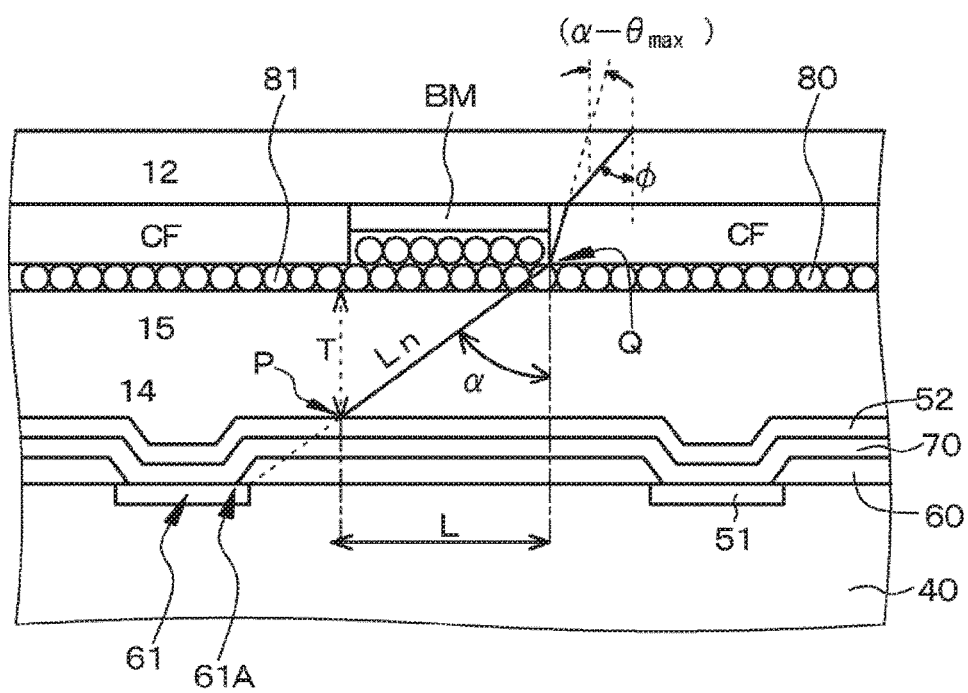
Figure 3:
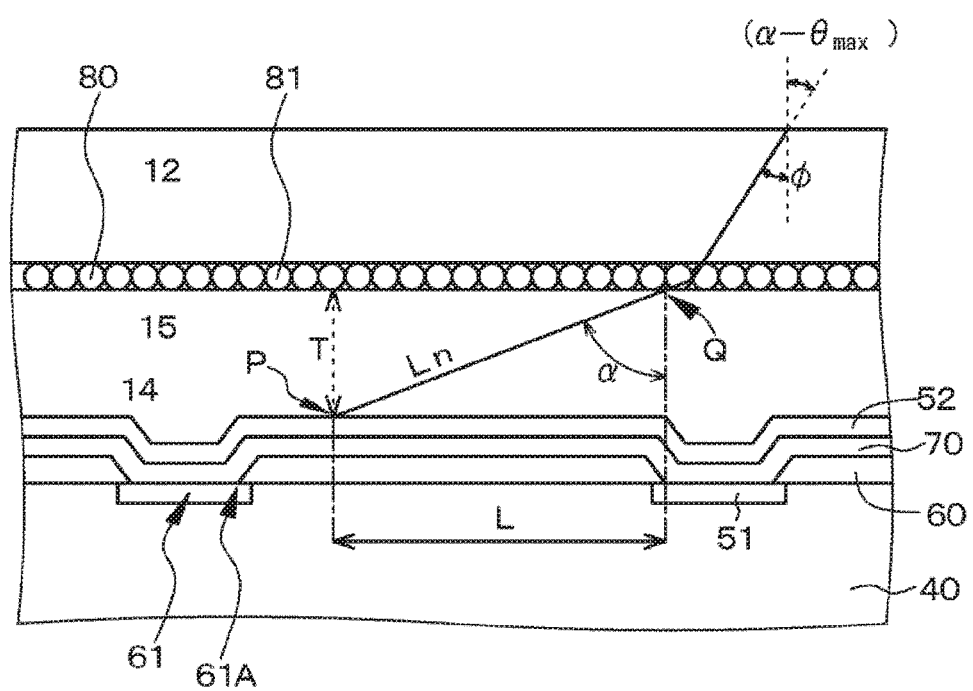
FIG. 3 is a diagram schematically illustrating behavior of light inside modification of the display device.

FIG. 2A illustrates a model diagram when parallel light is incident on one of the particles 81. FIGS. 2B and 3 schematically illustrate behavior of light inside the display device of Example 1. Note that hatching is omitted in FIGS. 2B and 3.

In the display device of Example 1, each of the particles 81 is regarded as a spherical lens. In addition, as illustrated in FIG. 2A, when it is assumed that a parallel light ray is incident on a spherical lens and is emitted from the spherical lens, a maximum value of an angle formed by an optical axis of the spherical lens and the light ray emitted from the spherical lens (maximum angle) is represented by $\theta_{max}$. Furthermore, an average distance between the second electrode 52 and the light diffusion layer 80 is represented by T, the shortest distance between light emitting elements 10 adjacent to each other is represented by L, the refractive index of a material constituting the second substrate is represented by $n_2$, and the refractive index of a medium in contact with the light diffusion layer 80 on a side of the second substrate is represented by n'. Provided that $n'>n_2$ is satisfied. Herein, the color filter layer CF is formed. Therefore, as illustrated in FIG. 2B, when a point where the second electrode 52 intersects with the shortest straight line connecting an edge of the first electrode 51 constituting a certain light emitting element 10 and an edge Q of the color filter layer CF constituting an adjacent light emitting element adjacent to the certain light emitting element 10 is represented by P, the shortest distance L means the shortest horizontal distance from the point P to the edge Q of the color filter layer constituting the adjacent light emitting element (refer to FIG. 2B). The maximum angle $\theta_{max}$ is a value depending on the refractive index of a material constituting the particles 81 and the refractive index of a material constituting the transparent material layer 82.

Among light rays emitted from a light emitting layer located near the edge 61A of the opening 61, a light ray which is incident on an adjacent light emitting element 10 and which is the shortest light ray incident on the edge Q of the color filter layer CF constituting the adjacent light emitting element 10 (light ray indicated by straight line Ln in FIG. 2B) is assumed. Incidentally, in the following description, in order to simplify discussion, the refractive index of a material constituting the sealing layer (sealing resin layer) 15 and the refractive index of a material constituting the protective film 14 are the same, and the refractive index of a material constituting the transparent material layer 82 is the same as the refractive index of a material constituting the color filter layer CF. An angle formed by a vertical line to the second substrate 12 (the same applies to the following) and this light ray is α. Incidentally, in a case where the refractive index of the material constituting the sealing layer (sealing resin layer) 15 is different from the refractive index of the material constituting the protective film 14, it is only required to define the angle α considering the thickness and the refractive index of the sealing layer (sealing resin layer) 15, and the thickness and the refractive index of the protective film 14. When this light ray is incident on one of the particles 81 and is emitted therefrom, the largest angle formed by one of the emitted light rays and the vertical line is $(\alpha-\theta_{max})$ as illustrated in FIG. 2A. The emitted light having such an angle is referred to as "maximum angle emitted light" for convenience.

In the maximum angle emitted light passing through the color filter layer CF and incident on the second substrate 12, when the emitting angle to the second substrate 12 is represented by φ, a relationship of $n'\cdot\sin(\alpha-\theta_{max})=n_2\cdot\sin(\varphi)$ (a) is satisfied. Here, when the refractive index of air is represented by $n_0$, if the emitting angle φ satisfies $n_2\cdot\sin(\varphi)\geq n_0$ (b), the maximum angle emitted light is totally reflected on an interface between the second substrate 12 and air, and is returned to the second substrate 12.

Therefore, $n'\cdot\sin(\alpha-\theta_{max})\geq n_0$ (c) is derived from formulas (a) and (b). Furthermore, a $\alpha\geq\theta_{max}+\arcsin(n_0/n')$ (d) is derived from formula (c). Provided that $\tan(\alpha)=L/T$ is satisfied.

As described above, by properly determining the parameters L and T, the refractive indices of materials constituting the particles 81 and the transparent material layer 82, and the refractive index n' of a medium in contact with the light diffusion layer 80 on a side of the second substrate in order to satisfy formula (d), light emitted from the adjacent light emitting element 10 can be effectively and reliably reduced.

Specifically, in the display device of Example 1,

L=20 μm,

T=15 μm the refractive index of the particles 81: 1.46, and the refractive index of the transparent material layer 82: 1.8 were used.

Incidentally, depending on light distribution characteristics due to a microcavity effect, a required color gamut, and the like, there is a case where there is no problem even if some color mixing occurs. Therefore, regarding formula (d), it is only required to almost satisfy the relationship of formula (d). Specifically, a value obtained by multiplying the right side of formula (d) by 0.9 may be used.

$$\alpha \geq 0.9\{\theta_{max} + \arc\cdot\sin(n_0/n')\} \quad (d')$$

In the example illustrated in FIG. 3, unlike the example illustrated in FIG. 2B, the color filter layer is not formed, and the light diffusion layer 80 is directly formed on the second substrate 12. In this case, a medium in contact with the light diffusion layer 80 on a side of the second substrate is the second substrate 12. In addition, also in this case, formula (d) is satisfied. Therefore, by properly determining the parameters L and T, the refractive indices of materials constituting the particles 81 and the transparent material layer 82, and the refractive index n' of a material constituting the second substrate 12 in order to satisfy formula (d) or (d'), light emitted from the adjacent light emitting element 10 can be effectively and reliably reduced.

<Display Device of Comparative Example 1A>

A display device having the same configuration and structure as in Example 1 except that a light diffusion layer was not formed, obtained by bonding an anti-reflection (AR) film on an outer surface of the second substrate, was manufactured as a display device of Comparative Example 1A.

<Display Device of Comparative Example 1B>

A display device having the same configuration and structure as in Example 1 except that a light diffusion layer was not formed, obtained by bonding a circular polarization plate on an outer surface of the second substrate, was manufactured as a display device of Comparative Example 1B.

<Display Device of Comparative Example 1C>

A display device having the same configuration and structure as in Example 1 except that a light diffusion layer was not formed, obtained by bonding an anti-glare (AG) film on an outer surface of the second substrate, was manufactured as a display device of Comparative Example 1C.

In addition, using the display device of Comparative Example 1A as a reference, luminous efficiency, bleeding/glare feeling, and a state of reflection were examined in the display device of Example 1, the display device of Comparative Example 1B, and the display device of Comparative Example 1C. Results are indicated in Table 1 below. Note that bleeding/glare feeling is caused by light emitted from an adjacent light emitting element, and reflection is caused by a reflection component. In Table 1, "⊙" means very good, "○" means good, and "x" means poor.

TABLE 1

| | Example 1 | Comparative Example 1B | Comparative Example 1C | Comparative Example 1A |
|---|---|---|---|---|
| Luminous efficiency | 0.90 | 0.42 | 0.95 | 1.00 |
| Bleeding/glare feeling | ○ | ⊙ | X | ⊙ |
| Reflection | ○ | ⊙ | ○ | X |

The display device of Comparative Example 1A had no bleeding/glare feeling and had a very good result on bleeding/glare feeling, but had intense reflection and had a poor result on reflection. The display device of Comparative Example 1B had no bleeding/glare feeling or no reflection and had very good results on bleeding/glare feeling and reflection, but had low luminous efficiency. The display device of Comparative Example 1C had no reflection and had a good result on reflection, but had intense bleeding/glare feeling and had a poor result on bleeding/glare feeling.

The display device of Example 1 had no reflection or no bleeding/glare feeling and had good results on reflection and bleeding/glare feeling, and had high luminous efficiency. The display device of Example 1 is a display device with balanced characteristics.

As described above, in the display device of Example 1, the light diffusion layer containing particles (fine particles) is formed between the sealing layer and the second substrate, and therefore a reflection component can be reduced, and reflection can be reduced. In addition, orthographic images of the particles in the light diffusion layer do not overlap each other on the second substrate, and therefore each of the particles functions as a kind of lens. As a result, when light emitted from a certain light emitting element enters an adjacent light emitting element and is emitted from the adjacent light emitting element to an outside, a ratio of the light totally reflected on an outer surface of the second substrate and returning to the adjacent light emitting element is increased. That is, the light emitted from the adjacent light emitting element can be reduced. Therefore, it is possible to suppress occurrence of deterioration in quality of a displayed image, such as image blur, bleeding, or resolution reduction. In addition, color mixing in an adjacent light emitting element can be suppressed. As a result, a wide color gamut can be realized, and a display device with high quality and low power consumption can be provided.

Example 2

Figure 4:
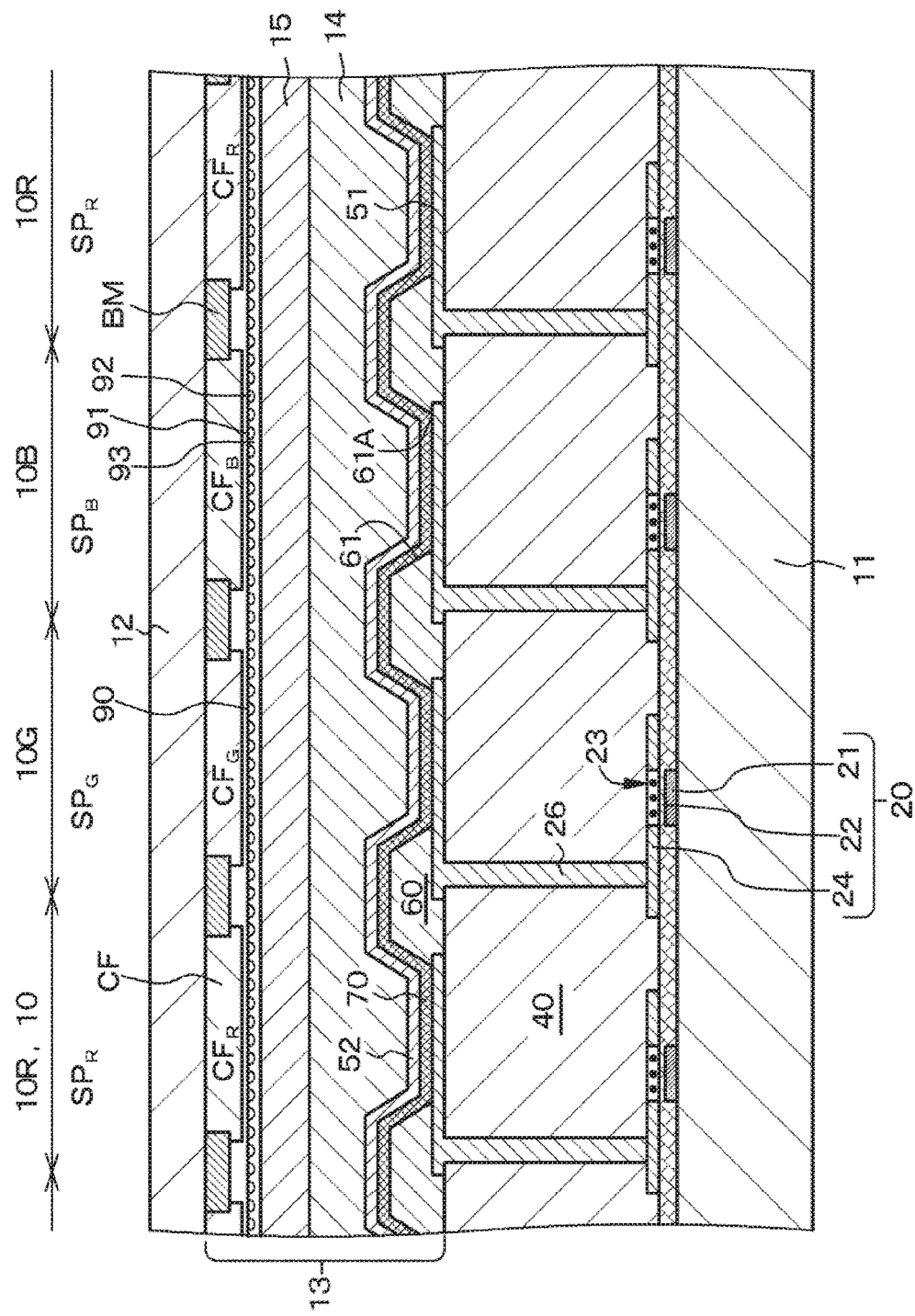
FIG. 4 is a schematic partial cross-sectional view of a display device of Example 2.

Example 2 relates to the display device according to the second aspect of the present disclosure. FIG. 4 illustrates a schematic partial cross-sectional view of the display device of Example 2. Note that, in FIG. 4 or FIG. 6 described below, hatching is omitted for the light diffusion layer, the flat portion, and the flat portion. In the display device of Example 2, the light diffusion layer 90 is formed between the sealing layer 15 and the second substrate 12, and the light diffusion layer 90 includes a flat portion 91 and a plurality of protruding portions 92 each constituted by a part of a spherical surface protruding from the flat portion 91. Specifically, each of the protruding portions 92 has a hemispherical shape.

In Example 2, when each of the protruding portions 92 is regarded as a part of a spherical lens, the above formula (c) or (d) and (d') are satisfied. Furthermore, the diameter of a part of a spherical surface constituting each of the protruding portions 92 is 1/10 or more of the wavelength of light emitted from the light emitting layer and is not more than the wavelength of the light emitted from the light emitting layer. Here, the wavelength of the light emitted from the light emitting layer is similar to that in Example 1, and the diameter of a part of a spherical surface constituting each of the protruding portions 92 is 1.5 μm.

Furthermore, in the light diffusion layer 90 of the display device of Example 2, a material constituting the flat portion 91 and the protruding portions 92 includes $SiO_2$. In the light diffusion layer 90 in the display device of Example 2, the protruding portions 92 are filled with a transparent material layer 93. A material constituting the transparent material layer 93 includes an acrylic resin. When the refractive index of a material constituting the flat portion and the protruding portions is represented by $n_{21}$ and the refractive index of a material constituting the transparent material layer is represented by $n_{22}$, $|n_{21} - n_{22}| \geq 0.1$ is satisfied. Here, $n_{21} = 1.46$, and $n_{22} = 1.8$ are satisfied.

In the display device of Example 2, area variation of the protruding portions 92 based on the effective area of the light emitting elements 10 is within 3%, specifically, 1%. By setting the area variation within such a range, it is possible to suppress a diffraction pattern due to regularity of the protruding portions 92, occurrence of glare, and the like. Furthermore, when the total area of the protruding portions 92 is represented by $S_1'$ and the effective area of the light emitting elements 10 is represented by $S_0$, $S_1'/S_0 \leq 0.9$ is satisfied. Specifically, $S_1'/S_3 = 0.2$ is satisfied.

In the light diffusion layer 90 in the display device of Example 2, the flat portion 91 and the protruding portions 92 are formed specifically by a well-known method for forming a microlens, more specifically by forming a hemispherical resist layer on a material layer constituting the light diffusion layer 90, for example, by a well-known method, and then etching back the material layer constituting the light diffusion layer 90 and the resist layer.

The configuration and structure of the display device of Example 2 can be similar to those of the display device of Example 1 except for the configuration and structure of the light diffusion layer 90 described above, and therefore detailed description will be omitted.

In the display device of Example 2, the light diffusion layer including the flat portion and the plurality of protruding portions is formed between the sealing layer and the second substrate, and therefore a reflection component can be reduced, and reflection can be reduced. In addition, the light diffusion layer includes the flat portion and the plurality of protruding portions each constituted by a part of a spherical surface, and therefore each of the protruding portions functions as a kind of lens. As a result, when light emitted from a certain light emitting element enters an adjacent light emitting element and is emitted from the adjacent light emitting element to an outside, a ratio of the light totally reflected on an outer surface of the second substrate and returning to the adjacent light emitting element is increased. That is, the light emitted from the adjacent light emitting element can be reduced. Therefore, it is possible to suppress occurrence of deterioration in quality of a displayed image, such as image blur, bleeding, or resolution reduction. In addition, color mixing in an adjacent light emitting element can be suppressed. As a result, a wide color gamut can be realized, and a display device with high quality and low power consumption can be provided.

Example 3

Figure 5:
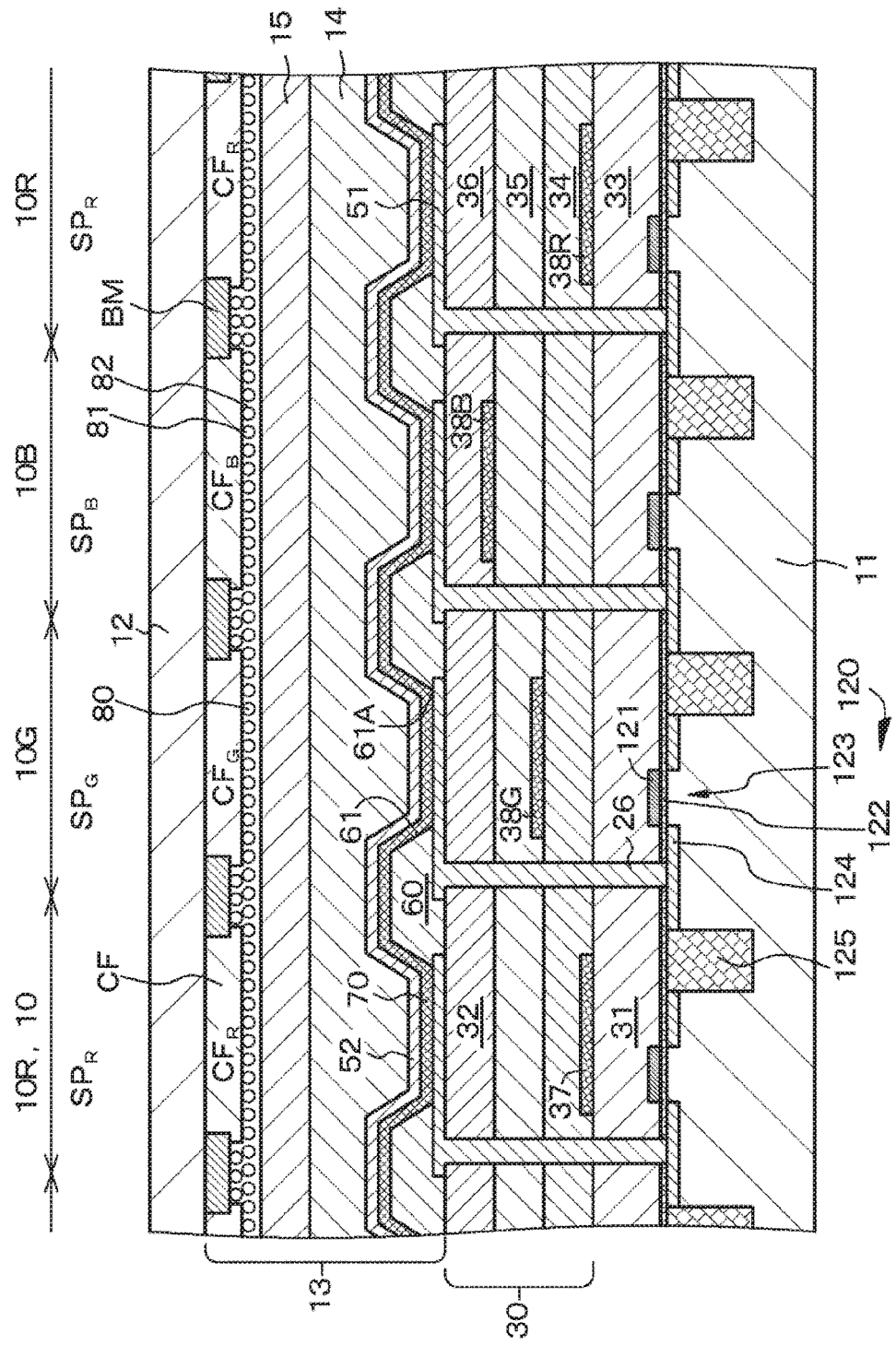
FIG. 5 is a schematic partial cross-sectional view of a display device of Example 3.
Figure 6:
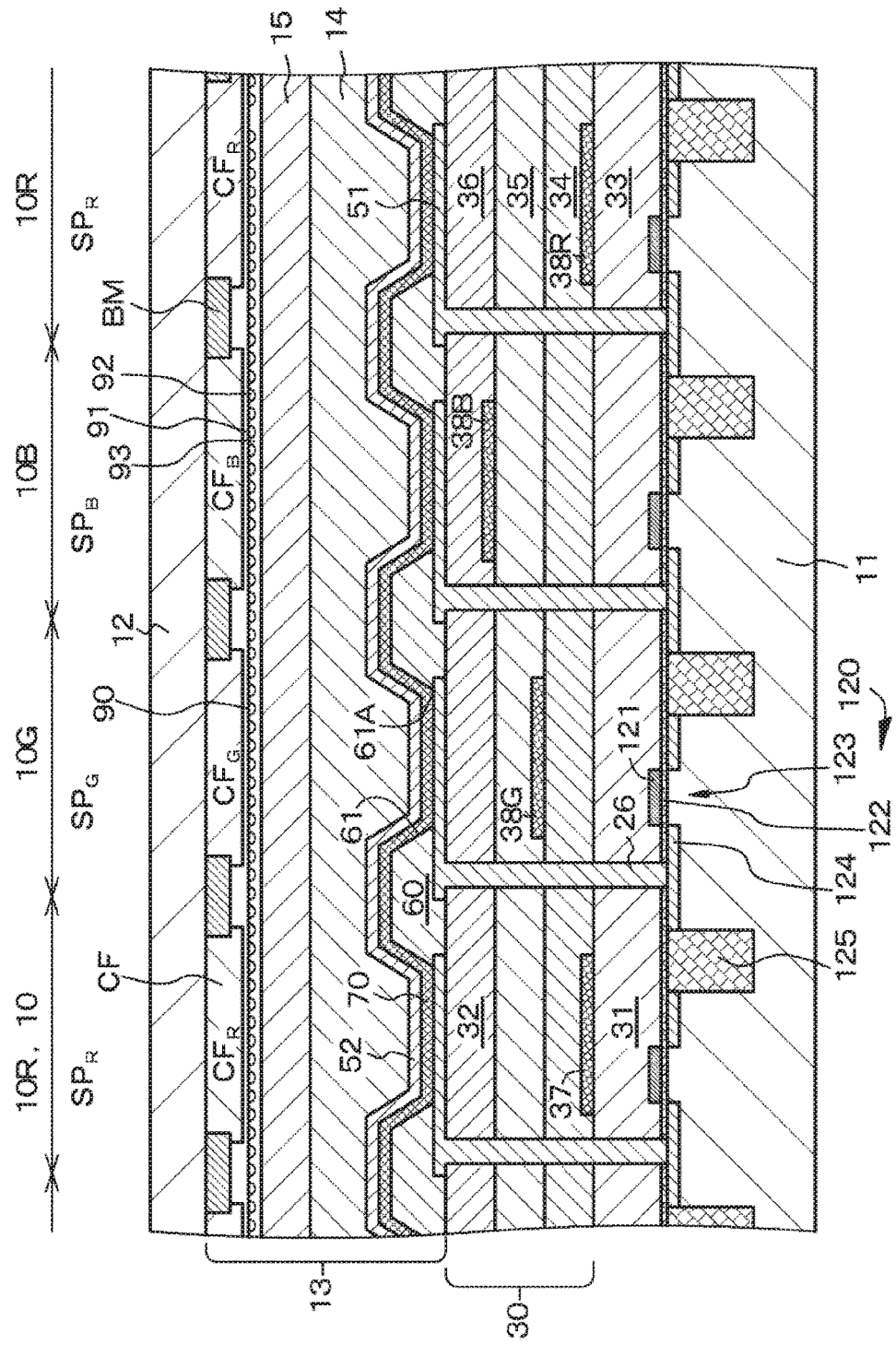
FIG. 6 is a schematic partial cross-sectional view of a modification example of the display device of Example 3.
Figure 7:
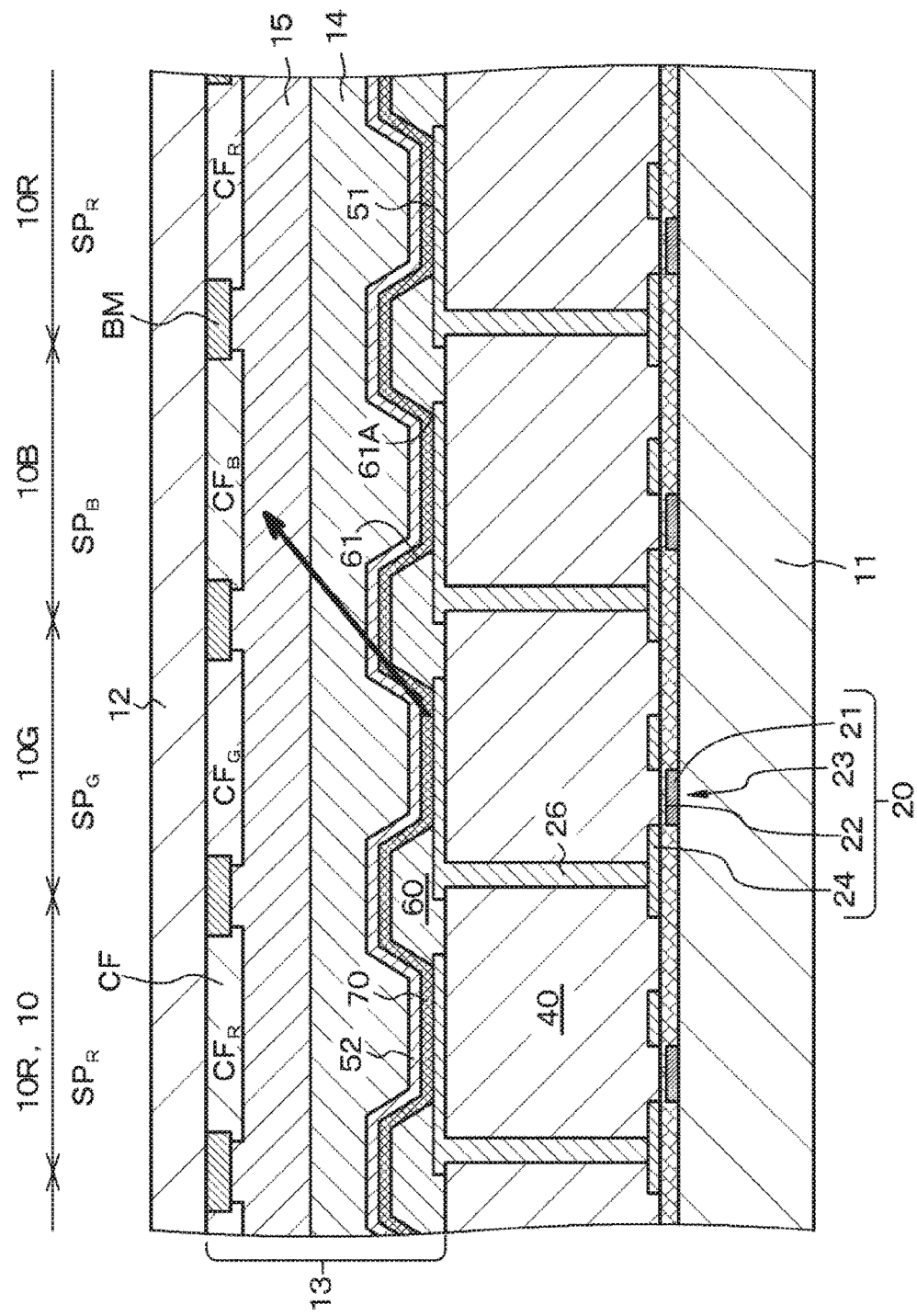
FIG. 7 is a schematic partial cross-sectional view of a display device for explaining a problem of a conventional display device.

Example 3 is a modification of Examples 1 and 2. In Example 3, a light reflecting layer is formed below a first electrode via an interlayer insulation layer, and a resonator structure is formed between the light reflecting layer and a second electrode. FIG. 5 illustrates a schematic partial cross-sectional view of the display device of Example 3 obtained by modifying the display device of Example 1. In addition, FIG. 6 illustrates a schematic partial cross-sectional view of the display device of Example 3 obtained by modifying the display device of Example 2.

Each of the light emitting element 10 of Example 3 includes a lower layer/interlayer insulation layer 31, a light reflecting layer 37 formed on the lower layer/interlayer insulation layer 31, an upper layer/interlayer insulation layer 32 covering the lower layer/interlayer insulation layer 31 and the light reflecting layer 37, a first electrode 51 formed on the upper layer/interlayer insulation layer 32, an insulation layer 60 formed at least on a region of the upper layer/interlayer insulation layer 32 on which the first electrode 51 is not formed, an organic layer 70 formed over the insulation layer 60 from above the first electrode 51 and having a light emitting layer including an organic light emitting material, and a second electrode 52 formed on the organic layer 70.

In addition, the display device of Example 3 is a display device in which a plurality of pixels each constituted by a first light emitting element 10R, a second light emitting element 10G, and a third light emitting element 10B is arranged in a two-dimensional matrix. The plurality of pixels has a laminated structure obtained by sequentially laminating a lowermost layer/interlayer insulation layer 33, a first interlayer insulation layer 34, a second interlayer insulation layer 35, and an uppermost layer/interlayer insulation layer 36. In addition, each of the light emitting elements 10R, 10G, and 10B includes the first electrode 51 formed on the uppermost layer/interlayer insulation layer 36, the insulation layer 60 formed at least on a region of the uppermost layer/interlayer insulation layer 36 on which the first electrode 51 is not formed, the organic layer 70 formed over the insulation layer 60 from above the first electrode 51 and having a light emitting layer including an organic light emitting material, and the second electrode 52 formed on the organic layer 70. The first light emitting element 10R includes a first light reflecting layer 38R formed between the lowermost layer/interlayer insulation layer 33 and the first interlayer insulation layer 34. The second light emitting element 10G includes a second light reflecting layer 38G formed between the first interlayer insulation layer 34 and the second interlayer insulation layer 35. The third light emitting element 10B includes a third light reflecting layer 38B formed between the second interlayer insulation layer 35 and the uppermost layer/interlayer insulation layer 36.

Note that the first interlayer insulation layer 34, the second interlayer insulation layer 35, and the uppermost layer/interlayer insulation layer 36 are collectively referred to as an interlayer insulation layer/laminated structure 30.

Alternatively, in another expression, the display device of Example 3 includes the first substrate 11, the second substrate 12, and the image display unit 13 sandwiched by the first substrate 11 and the second substrate 12. In the image display unit 13, the plurality of light emitting elements 10 (10R, 10G, and 10B) of Example 3 is arranged in a two-dimensional matrix. Herein, the light emitting elements are formed on a side of the first substrate.

The first electrode 51 includes ITO. The light reflecting layer 37 (first light reflecting layer 38R, second light reflecting layer 38G, and third light reflecting layer 38B) has a laminated structure of titanium (Ti)/aluminum (Al). Furthermore, the first substrate 11 includes a silicon semiconductor substrate, and the second substrate 12 includes a glass substrate. In addition, a MOSFET is formed on the silicon semiconductor substrate in place of a TFT.

In Example 3, the organic layer 70 may include the materials exemplified in Example 1, or may include materials exemplified below. Also in Example 1, the organic layer 70 may include materials exemplified below.

That is, in Example 3, the organic layer 70 has a laminated structure of a hole injection layer (HIL), a hole transport layer (HTL), a light emitting layer, an electron transport layer (ETL), and an electron injection layer (EIL). The light emitting layer is constituted by at least two light emitting layers that emit different colors, and light emitted from the organic layer 70 is white. Specifically, the light emitting layer has a structure in which three layers of a red light emitting layer that emits red light, a green light emitting layer that emits green light, and a blue light emitting layer that emits blue light are laminated. The red light emitting element 10R, the green light emitting element 10G, and the blue light emitting element 10B have the same configuration and structure except for the color filters and the positions of the light reflecting layer.

The hole injection layer increases a hole injection efficiency, functions as a buffer layer for preventing leakage, and has a thickness of about 2 nm to 10 nm, for example. The hole injection layer includes a hexaazatriphenylene derivative represented by the following formula (A) or (B), for example.

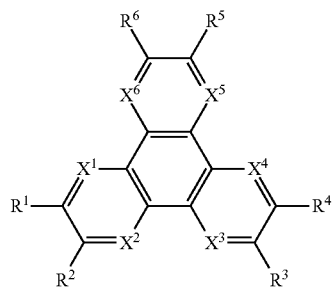
(A)

Herein, $R^1$ to $R^6$ each independently represent a substituent selected from a hydrogen atom, a halogen atom, a hydroxy group, an amino group, an arulamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group, and adjacent $R'''$s (m=1 to 6) may be bonded to each other via a cyclic structure. In addition, $X^1$ to $X^6$ each independently represent a carbon atom or a nitrogen atom.

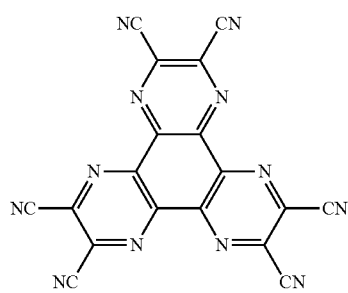
(B)

The hole transport layer is a layer that increases a hole transport efficiency to the light emitting layer. When an electric field is applied to the light emitting layer, recombination of electrons and holes occurs to generate light. The electron transport layer is a layer that increases an electron transport efficiency to the light emitting layer, and the electron injection layer is a layer that increases an electron injection efficiency to the light emitting layer.

The hole transport layer includes 4,4',4''-tris(3-methylphenylphenylamino) triphenylamine <m-MTDATA> or α-naphthylphenyl diamine <αNPD> having a thickness of about 40 nm, for example.

The light emitting layer is a light emitting layer that generates white light by color mixing, and is formed by laminating a red light emitting layer, a green light emitting layer, and a blue light emitting layer as described above, for example.

When an electric field is applied to the red light emitting layer, a part of holes injected from the first electrode 51 and a part of electrons injected from the second electrode 52 are recombined to generate red light. Such a red light emitting layer contains at least one kind of material among a red light emitting material, a hole transport material, an electron transport material, and a both charge transport material, for example. The red light emitting material may be a fluorescent material or a phosphorescent material. The red light emitting layer having a thickness of about 5 nm is formed by mixing 30% by mass of 2,6-bis[(4'-methoxydiphenylamino) styryl]-1,5-dicyanonaphthalene <BSN> with 4,4-bis(2,2-diphenylvinin) biphenyl <DPVBi>, for example.

When an electric field is applied to the green light emitting layer, a part of holes injected from the first electrode 51 and a part of electrons injected from the second electrode 52 are recombined to generate green light. Such a green light emitting layer contains at least one kind of material among a green light emitting material, a hole transport material, an electron transport material, and a both charge transport material, for example. The green light emitting material may be a fluorescent material or a phosphorescent material. The green light emitting layer having a thickness of about 10 nm is formed by mixing 5% by mass of coumarin 6 with DPVBi, for example.

When an electric field is applied to the blue light emitting layer, a part of holes injected from the first electrode 51 and a part of electrons injected from the second electrode 52 are recombined to generate blue light. Such a blue light emitting layer contains at least one kind of material among a blue light emitting material, a hole transport material, an electron transport material, and a both charge transport material, for example. The blue light emitting material may be a fluorescent material or a phosphorescent material. The blue light emitting layer having a thickness of about 30 nm is formed by mixing 2.5% by mass of 4,4'-bis [2-{4-(N, N-diphenylamino) phenyl} vinyl]biphenyl <DPAVBi> with DPVBi, for example.

The electron transport layer having a thickness of about 20 nm includes 8-hydroxyquinoline aluminum <Alq3>, for example. The electron injection layer having a thickness of about 0.3 nm includes LiF or $Li_2O$, for example.

The lowermost layer/interlayer insulation layer 33, the interlayer insulation layer/laminated structure 30, the organic layer 70, and the second electrode 52 are common in the plurality of light emitting elements. That is, the lowermost layer/interlayer insulation layer 33, the interlayer insulation layer/laminated structure 30, the organic layer 70, and the second electrode 52 are not patterned and are in a so-called solid film state. As described above, by forming a solid film of a light emitting layer common in all the light emitting elements without forming the light emitting layer separately for each light emitting element (patterning formation), the light emitting elements can be also applied to a small and high-resolution display device having a field angle of several inches or less and a pixel pitch of several tens of micrometers or less, for example.

Each of the light emitting elements 10 has a resonator structure in which the organic layer 70 is a resonance part. Incidentally, in order to appropriately adjust a distance from a light emitting surface to a reflecting surface (specifically, a distance from a light emitting surface to the light reflecting layer 37 and the second electrode 52), the thickness of the organic layer 70 is preferably $8 \times 10^{-8}$ m or more and $5 \times 10^{-7}$ m or less, and more preferably $1.5 \times 10^{-7}$ m or more and $3.5 \times 10^{-7}$ m or less. In an organic EL display device having a resonator structure, actually, the red light emitting element 10R causes red light emitted from the light emitting layer to resonate, and emits reddish light (light having a light spectrum peak in a red region) from the second electrode 52. In addition, the green light emitting element 10G causes green light emitted from the light emitting layer to resonate, and emits greenish light (light having a light spectrum peak in a green region) from the second electrode 52. Furthermore, the blue light emitting element 10B causes blue light emitted from the light emitting layer to resonate, and emits bluish light (light having a light spectrum peak in a blue region) from the second electrode 52.

In Example 3, a transistor (specifically, for example, a MOSFET) 120 formed on a silicon semiconductor substrate (first substrate 11) is disposed under the lower layer/interlayer insulation layer 31 (lowermost layer/interlayer insulation layer 33). In addition, the first electrode 51 and the transistor 120 formed on the silicon semiconductor substrate (first substrate 11) are connected to each other via the contact hole (contact plug) 26 formed in the lowermost layer/interlayer insulation layer 33 and the interlayer insulation layer/laminated structure 30. Herein, the transistor 120 includes a MOSFET is constituted by a gate electrode 121, a gate insulation layer 122, a channel formation region 123, and a source/drain region 124. An element isolation region 125 is formed between the transistors 120, and the transistors 120 are thereby separated from each other.

The configuration and structure of the display device of Example 3 can be similar to those of the display devices of Examples 1 and 2 except for the above points, and therefore detailed description will be omitted.

Hitherto, the display device of the present disclosure has been described on the basis of preferable Examples. However, the display device of the present disclosure is not limited to these Examples. The configurations and structures of the display device and the light emitting element described in Examples, various materials constituting the display devices and the light emitting elements, the methods for manufacturing the display devices and the light emitting elements, and the like are illustrative and can be changed appropriately. The diameter of each of the particles and each of the protruding portions constituting the light diffusion layer may be different among the red light emitting element, the green light emitting element, and the blue light emitting element. The number of particles or protrusions per effective area of the light emitting elements may be different among the red light emitting element, the green light emitting element, and the blue light emitting element. Furthermore, the shape of each of the protruding portions may be varied depending on the position of the light emitting element. In Examples, one pixel is constituted exclusively by three sub-pixels formed by a combination of a white light emitting element and a color filter layer. However, one pixel may be formed by four sub-pixels obtained by adding a light emitting element that emits white light. Alternatively, one pixel may be constituted by three sub-pixels (light emitting elements) of a sub-pixel having a red light emitting layer and constituted by a light emitting element that emits red light, a sub-pixel having a green light emitting layer and constituted by a light emitting element that emits green light, a sub-pixel having a blue light emitting layer and constituted by a light emitting element that emits blue light, or may be constituted by four sub-pixels (light emitting elements) obtained by adding a sub-pixel constituted by a light emitting element that emits white light (or a light emitting element that emits complementary color light).

In Examples, the description has been made on the basis of the top emission type display device that emits light from the second substrate. However, a bottom emission type display device that emits light from the first substrate may be used. Furthermore, the color filter layer is disposed on the second substrate. However, a display device having an on-chip color filter (OCCF) structure in which the color filter layer is disposed on the first substrate may be used alternatively. In addition, the description has been made on the basis of the spherical (truly spherical) particles. However, a particle having an aspheric surface such as a spheroid can be used. In this case, "T" of formula tan $(\alpha)=L/T$ only needs to be defined on the basis of a long axis, and a value or a formula relating to the maximum angle $\theta_{max}$ only needs to be defined on the basis of a short axis.

Note that the present disclosure may have the following configurations.

[A01] <<Display Device: First Aspect>>

A display device including:

a first substrate; a second substrate; and a plurality of light emitting elements located between the first substrate and the second substrate and arranged in a two-dimensional matrix, the display device emitting light via the second substrate, in which each of the light emitting elements is formed by laminating, from a side of the first substrate, a first electrode, an organic layer having a light emitting layer, a second electrode, and a sealing layer, a light diffusion layer including particles is formed between the sealing layer and the second substrate, and orthographic images of the particles in the light diffusion layer do not overlap each other on the second substrate.

[A02] The display device according to [A01], in which each of the particles is spherical, when each of the particles is regarded as a spherical lens and a parallel light ray is incident on the spherical lens and is emitted from the spherical lens, if a maximum value of an angle formed by an optical axis of the spherical lens and the light ray emitted from the spherical lens is represented by $\theta_{max}$, an average distance between the second electrode and the light diffusion layer is represented by T, the shortest distance between light emitting elements adjacent to each other is represented by L, a refractive index of a medium in contact with the light diffusion layer on a side of the second substrate is represented by n', and a refractive index of air is represented by $n_0$, $\alpha \geq \theta_{max}+\arcsin(n_0/n')$ is satisfied, provided that tan $(\alpha)=L/T$ is satisfied.

[A03] The display device according to [A02], in which $\alpha \geq 0.9\{\theta_{max}+\arcsin(n_0/n')\}$ is satisfied.

[A04] The display device according to any one of [A01] to [A03], in which each of the particles is spherical, and a diameter of each of the particles is 1/10 or more of a wavelength of light emitted from the light emitting layer.

[A05] The display device according to any one of [A01] to [A04], in which
when a thickness of the light diffusion layer is represented by t and a diameter of each of the particles is represented by R,
1<t/R<2 is satisfied.

[A06] The display device according to any one of [A01] to [A05], in which
area variation of orthographic images of the particles in the light diffusion layer on the second substrate based on an effective area of the light emitting elements is within 3%.

[A07] The display device according to any one of [A01] to [A06], in which
when a total area of orthographic images of the particles in the light diffusion layer on the second substrate is represented by $S_1$, and an effective area of the light emitting elements is represented by $S_0$,
$S_1/S_0 \leq 0.9$ is satisfied.

[A08] The display device according to any one of [A01] to [A07], in which a color filter layer is formed between the light diffusion layer and the second substrate, and a light shielding layer is formed between the color filter layer and the color filter layer.

[B01] <<Display Device: Second Aspect>>
A display device including:
a first substrate; a second substrate; and
a plurality of light emitting elements located between the first substrate and the second substrate and arranged in a two-dimensional matrix, the display device emitting light via the second substrate, in which
each of the light emitting elements is formed by laminating, from a side of the first substrate, a first electrode, an organic layer having a light emitting layer, a second electrode, and a sealing layer,
a light diffusion layer is formed between the sealing layer and the second substrate, and
the light diffusion layer includes a flat portion and a plurality of protruding portions each constituted by a part of a spherical surface protruding from the flat portion.

[B02] The display device according to [B01], in which
when each of the protruding portions is regarded as a part of a spherical lens and a parallel light ray is incident on the spherical lens and is emitted from the spherical lens, if a maximum value of an angle formed by an optical axis of the spherical lens and the light ray emitted from the spherical lens is represented by $\theta_{max}$, an average distance between the second electrode and the light diffusion layer is represented by T, the shortest distance between light emitting elements adjacent to each other is represented by L, a refractive index of a medium in contact with the light diffusion layer on a side of the second substrate is represented by n', and a refractive index of air is represented by $n_0$,
$\alpha \geq \theta_{max} + \arcsin(n_0/n')$ is satisfied,
provided that $\tan(\alpha) = L/T$ is satisfied.

[B03] The display device according to [B02], in which
$\alpha \geq 0.9 \{\theta_{max} + \arcsin(n_0/n')\}$ is satisfied.

[B04] The display device according to any one of [B01] to [B03], in which
a diameter of a part of the spherical surface constituting each of the protruding portions is 1/10 or more of a wavelength of light emitted from the light emitting layer.

[B05] The display device according to [B04], in which a diameter of a part of the spherical surface constituting each of the protruding portions is not more than a wavelength of light emitted from the light emitting layer.

[B06] The display device according to any one of [B01] to [B04], in which area variation of the protruding portions based on an effective area of the light emitting elements is within 3%.

[B07] The display device according to any one of [B01] to [B06], in which
when a total area of the protruding portions is represented by $S_1'$, and an effective area of the light emitting elements is represented by $S_0$,
$S_1'/S_0 \leq 0.9$ is satisfied.

[B08] The display device according to any one of [B01] to [B07], in which a color filter layer is formed between the light diffusion layer and the second substrate, and a light shielding layer is formed between the color filter layer and the color filter layer.

REFERENCE SIGNS LIST

10 Light emitting element (display element)
10R Red light emitting element (first light emitting element)
10G Green light emitting element (second light emitting element)
10B Blue light emitting element (third light emitting element)
$SP_R$ Red display sub-pixel
$SP_G$ Green display sub-pixel
$SP_B$ Blue display sub-pixel
11 First substrate
12 Second substrate
13 Image display unit
14 Protective film
15 Sealing layer (sealing resin layer)
20 Thin film transistor (TFT)
120 MOSFET
21, 121 Gate electrode
22, 122 Gate insulation layer
23, 123 Channel formation region
24, 124 Source/drain region
125 Element isolation region
26 Contact hole (contact plug)
30 Interlayer insulation layer/laminated structure
31 Lower layer/interlayer insulation layer
32 Upper layer/interlayer insulation layer
33 Lowermost layer/interlayer insulation layer
34 First interlayer insulation layer
35 Second interlayer insulation layer
36 Uppermost layer/interlayer insulation layer
37 Light reflecting layer
38R First light reflecting layer
38G Second light reflecting layer
38B Third light reflecting layer
40 Interlayer insulation layer
51 First electrode
52 Second electrode
60 Insulation layer
61 Opening
61A Edge of opening
70 Organic layer
81 Particle
80 Light diffusion layer
82 Transparent material layer
90 Light diffusion layer
91 Flat portion
92 Protruding portion
93 Transparent material layer
CF, $CF_R$, $CF_G$, $CF_B$ Color filter
BM Light shielding layer (black matrix layer)

The invention claimed is:

1. A display device comprising:
   a layer of transparent material, particles in the transparent material are of a substance that differs from the transparent material; and
   a layer of color filters including a first color filter and a second color filter, wherein
   the first color filter and the second color filter are arranged along a longitudinal direction,
   at least a portion of the particles are disposed in a region between the first color filter and the second color filter along the longitudinal direction, and
   each of the particles is hemispherical.

2. The display device according to claim 1, wherein the layer of the color filters is between a substrate and the layer of the transparent material.

3. The display device according to claim 2, further comprising:
   a light shield between the substrate and the layer of the transparent material.

4. The display device according to claim 3, wherein the light shield is between the first one of the color filters and the second one of the color filters.

5. The display device according to claim 3, wherein the light shield touches the substrate and the layer of the transparent material.

6. The display device according to claim 5, wherein the light shield touches the first one of the color filters and the second one of the color filters.

7. The display device according to claim 1, wherein the transparent material is between the first one of the color filters and the second one of the color filters.

8. The display device according to claim 1, wherein the transparent material fills spaces between the particles.

9. The display device according to claim 1, wherein the particles have a refractive index that differs from a refractive index of the transparent material.

10. The display device according to claim 9, wherein the particles have the refractive index that is greater than the refractive index of the transparent material.

11. The display device according to claim 1, wherein the particles comprise silica.

12. The display device according to claim 1, wherein the transparent material comprises a resin.

13. The display device according to claim 1, wherein the layer of the transparent material comprises a flat portion, with the particles protruding from the flat portion.

14. The display device according to claim 1, wherein a diameter of each of the particles is 1/10 or more of a wavelength of light emitted from light emitting layer.

15. The display device according to claim 1, wherein $1 < t/R < 2$ is satisfied, where
    "t" is a thickness for the layer of the transparent material,
    "R" is a diameter of each of the particles.

16. The display device according to claim 1, wherein $S1/S0 \leq 0.9$ is satisfied, where
    "S0" is an effective area of light emitting elements,
    "S1" is a total area of orthographic images of the particles in the layer of the transparent material.

17. The display device according to claim 16, wherein the layer of the transparent material is between the light emitting elements and the layer of the color filters.

18. The display device according to claim 17, wherein each of the light emitting elements comprise a light emitting layer between a first electrode and a second electrode.

* * * * *